(12) United States Patent
Nii et al.

(10) Patent No.: US 6,670,262 B2
(45) Date of Patent: Dec. 30, 2003

(54) METHOD OF MANUFACTURING SEMICONDUCTOR DEVICE

(75) Inventors: Koji Nii, Tokyo (JP); Yoshinori Okada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/112,770

(22) Filed: Apr. 2, 2002

(65) Prior Publication Data

US 2002/0187621 A1 Dec. 12, 2002

(30) Foreign Application Priority Data

Jun. 12, 2001 (JP) ........................................ 2001-177193

(51) Int. Cl.$^7$ .............................................. H01L 21/22
(52) U.S. Cl. ...................................................... 438/551
(58) Field of Search ................................. 438/551, 552

(56) References Cited

U.S. PATENT DOCUMENTS 6,337,284 B1 * 1/2002 Hwang et al. .............. 438/710
6,426,175 B2 * 7/2002 Furukawa et al. .......... 430/313

FOREIGN PATENT DOCUMENTS

| JP | 9-289153 | 11/1997 |
| JP | 10-178110 | 6/1998 |
| JP | 2000-36543 | 2/2000 |

* cited by examiner

Primary Examiner—David Nelms
Assistant Examiner—Thao P Le
(74) Attorney, Agent, or Firm—Oblon, Spivak, McClelland, Maier & Neustadt, P.C.

(57) ABSTRACT

A method of manufacturing a semiconductor device which is capable of forming a gate structure having dimensions as designed. A silicon oxide film, a polysilicon film and a silicon oxide film are formed in the order named on a silicon substrate. Then, the silicon oxide film is patterned to form silicon oxide films. Next, a photoresist is applied, and is then exposed to light using a photomask for defining the ends of gate structures as seen in a direction of a gate width. Next, the photoresist is developed to form openings. Using the photoresist as an etch mask, portions of the silicon oxide films exposed in the openings are etched away.

16 Claims, 33 Drawing Sheets

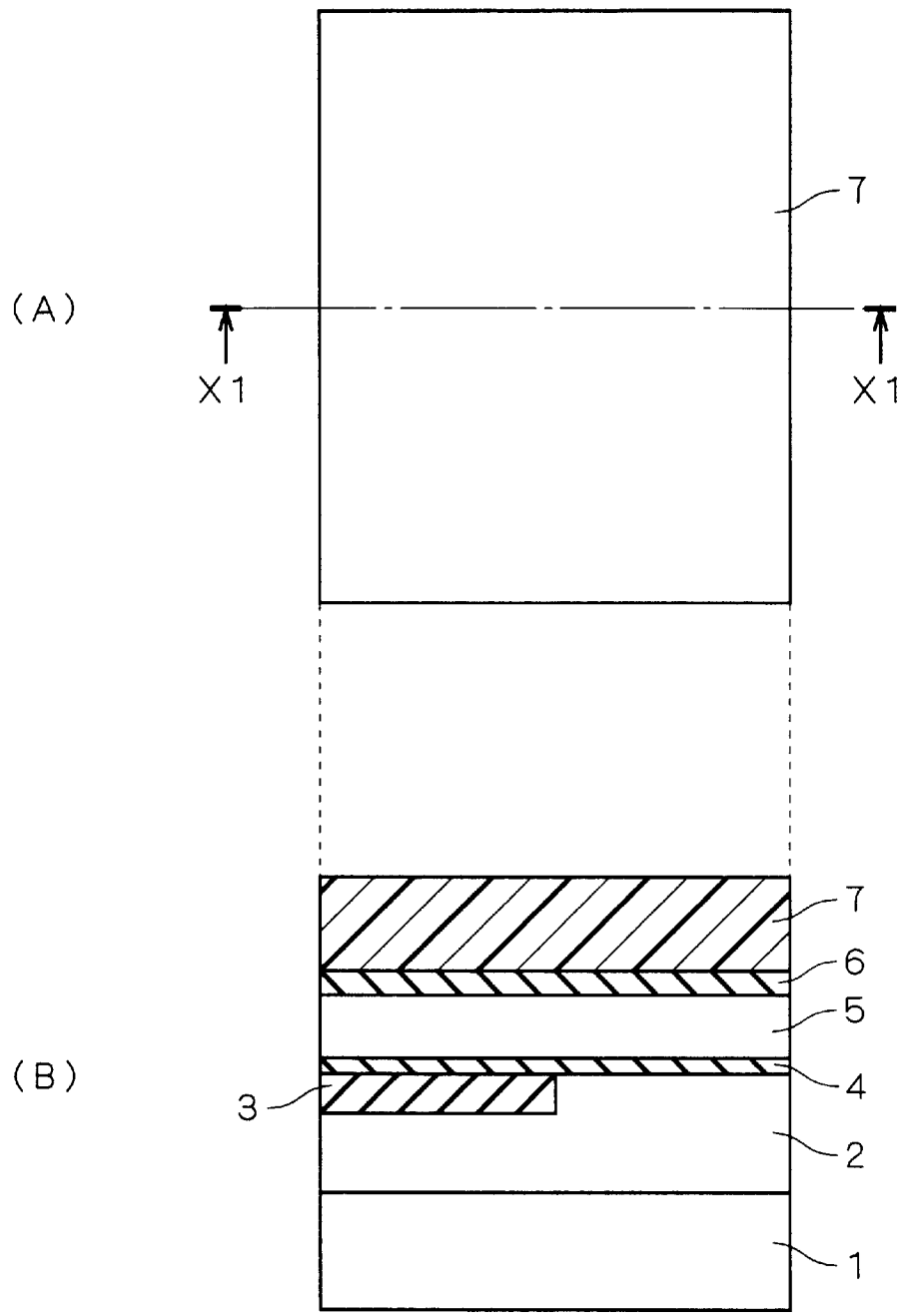

F I G . 17
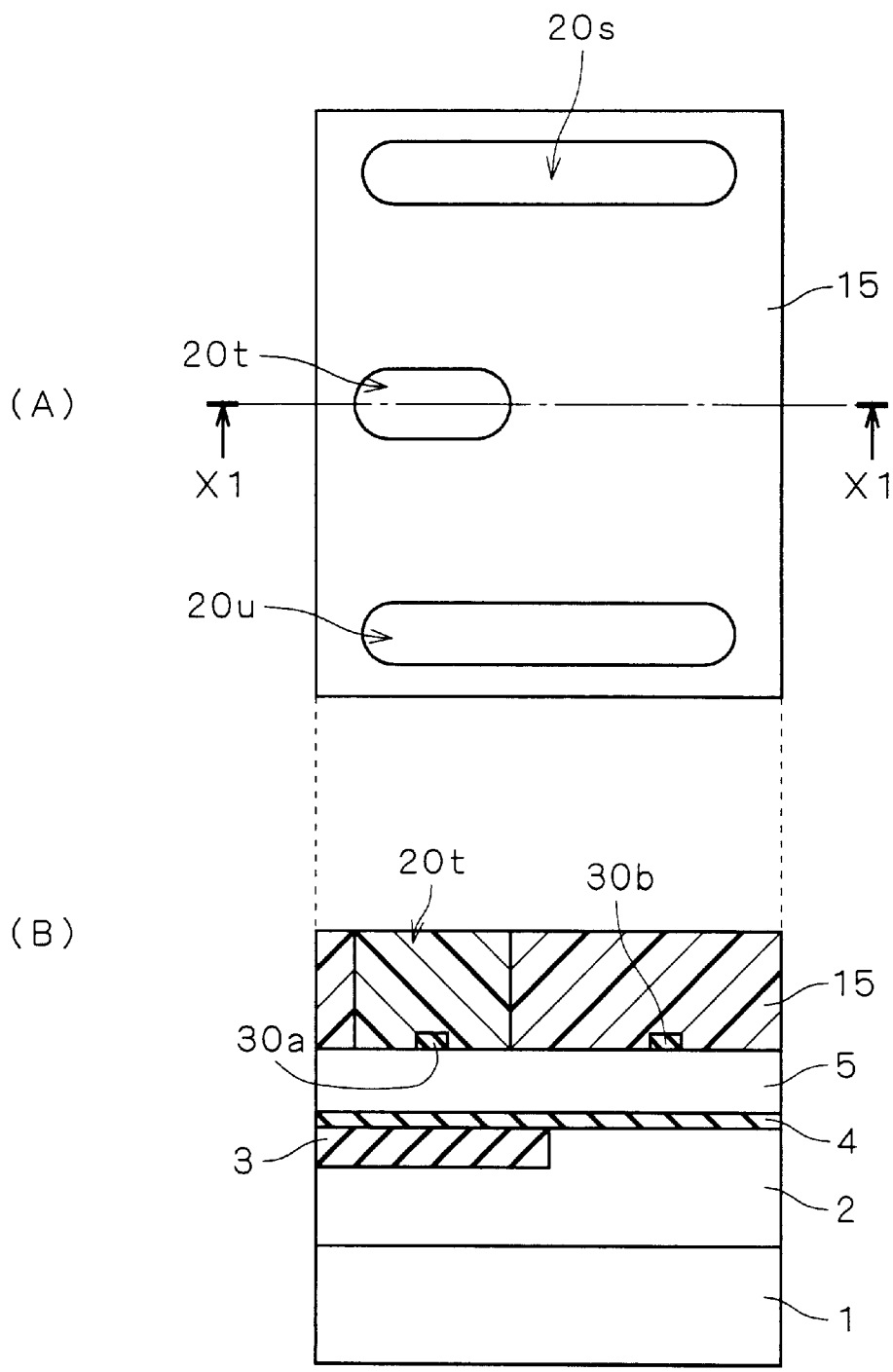

F I G . 18
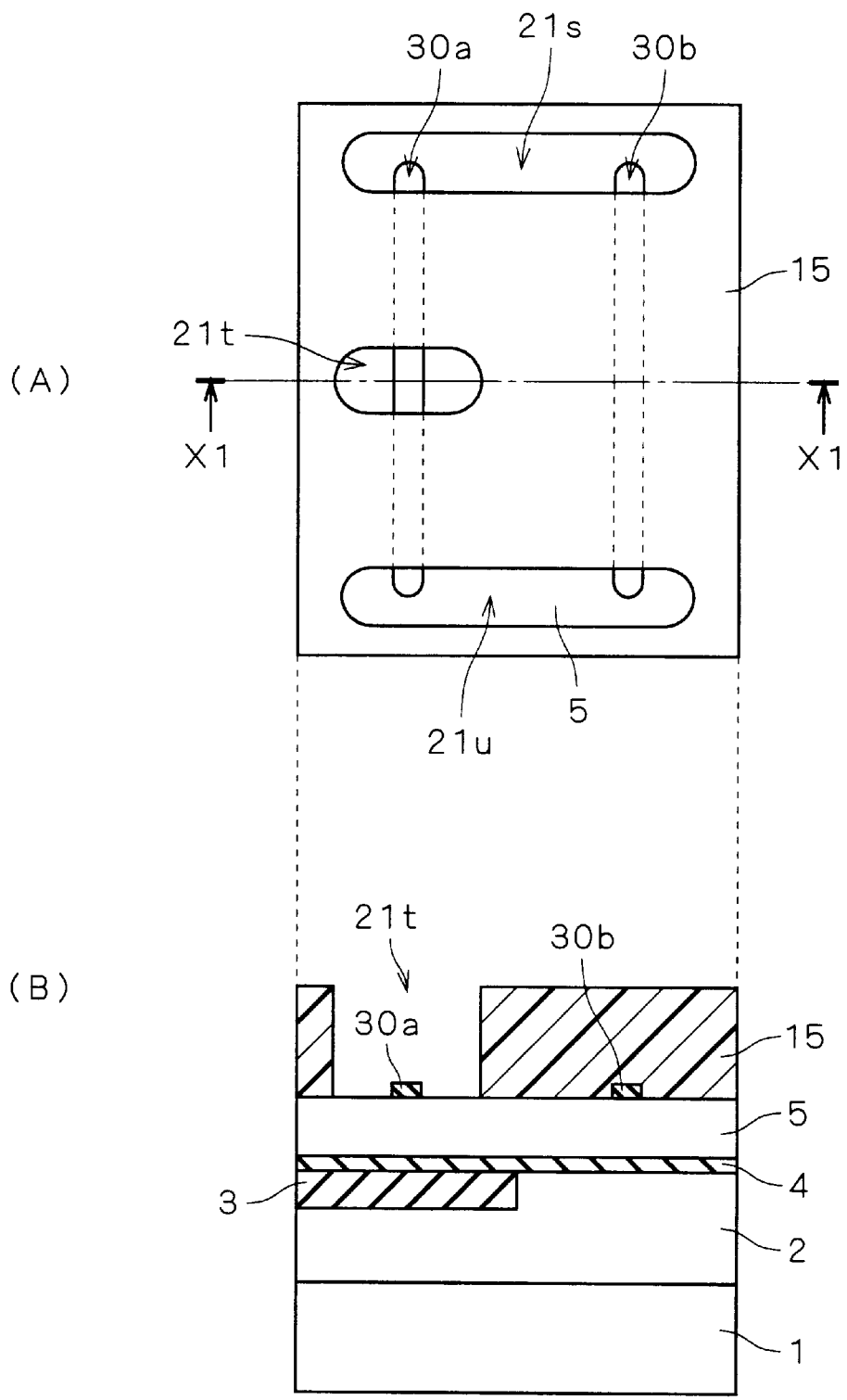

F I G . 2 1
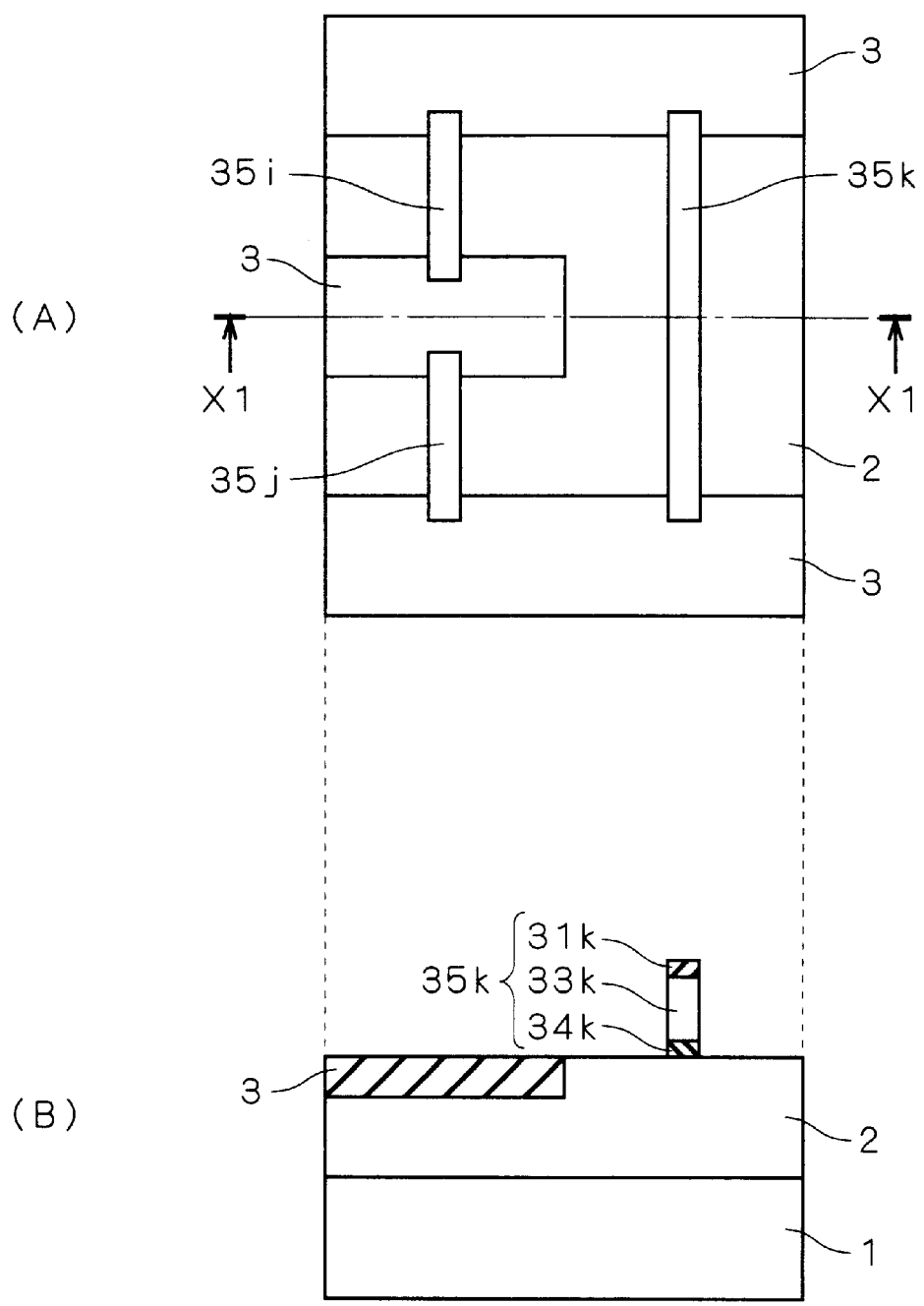

F I G . 2 5
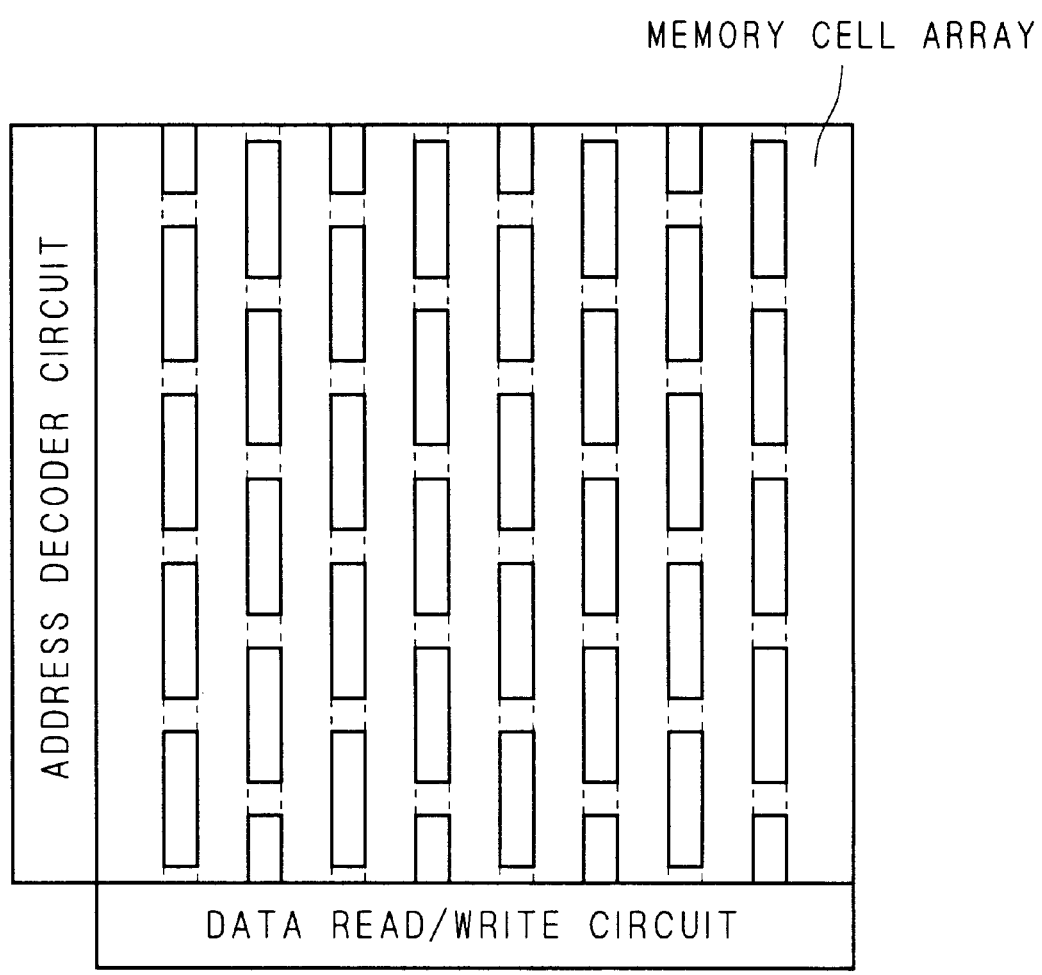

F I G . 26
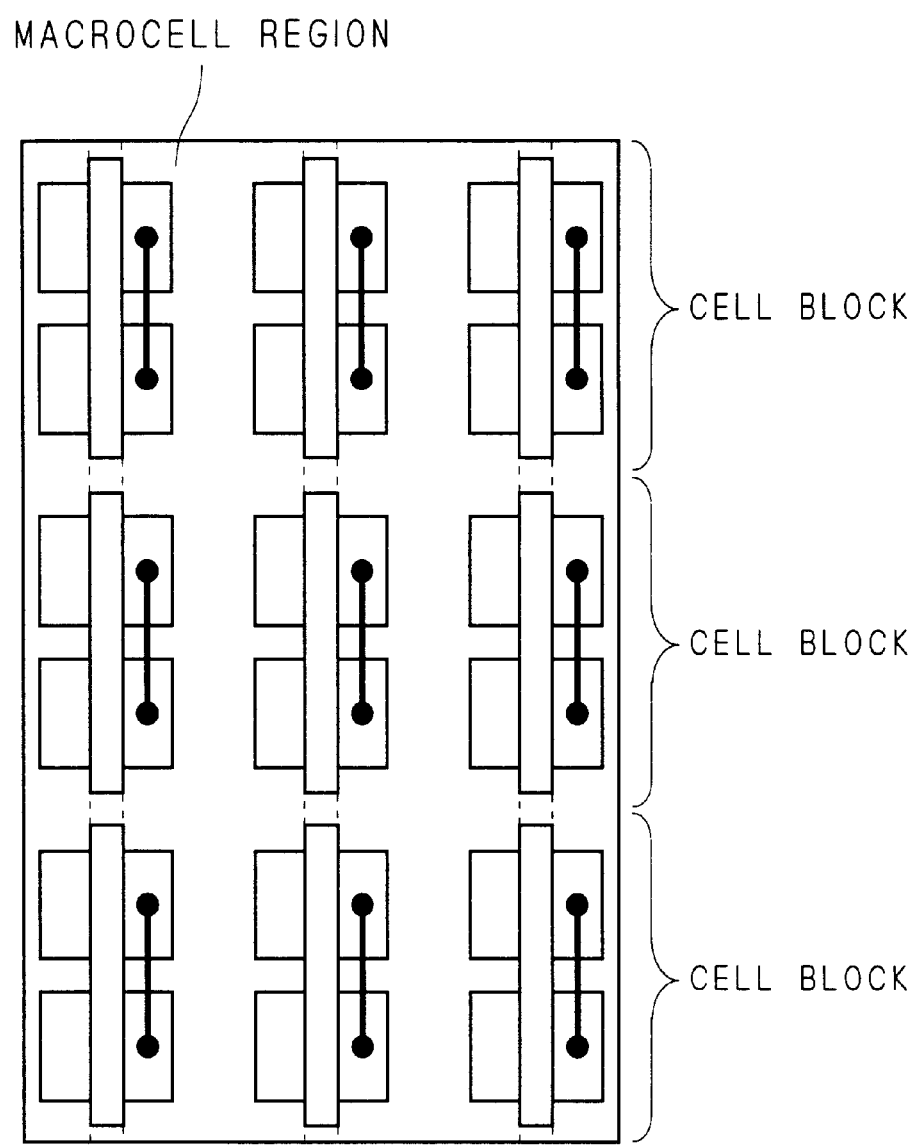

METHOD OF MANUFACTURING SEMICONDUCTOR DEVICE

BACKGROUND OF THE INVENTION

1. Field of the Invention

The present invention relates to a method of manufacturing a semiconductor device. More particularly, the invention relates to a method of forming a gate electrode of a MOSFET by the use of a photolithographic process and an etching process.

2. Description of the Background Art

FIGS. 27 through 33 show a background art method of manufacturing a semiconductor device in order of process steps. In FIGS. 27 through 33, top plan views are labelled (A), and sectional views showing sectional structures taken along a line X100—X100 in the top plan views are labelled (B).

With reference to FIG. 27, an impurity is initially introduced into an upper surface of a silicon substrate 101 to form a well 102. In this step, a p well is formed when a p type impurity such as phosphorus is introduced, and an n well is formed when an n type impurity such as boron is introduced. Next, a trench-type isolating insulation film 103 made of silicon oxide or the like is partially formed in the upper surface of the silicon substrate 101 by a known trench isolation technique. Referring to the top plan view labelled (A) in FIG. 27, a portion in which the isolating insulation film 103 is not formed serves as a device formation region for formation of a MOSFET. In other words, the device formation region is defined by the isolating insulation film 103.

Referring to FIG. 28, a silicon oxide film 104 is formed entirely on the well 102 and the isolating insulation film 103 by a CVD process using TEOS (Tetra Ethyl Ortho Silicate) as a source gas. Next, a polysilicon film 105 is formed entirely on the silicon oxide film 104 by a CVD process. Then, a silicon oxide film 106 is formed entirely on the polysilicon film 105 by a thermal oxidation process or a CVD process using TEOS as a source gas. Next, a negative photoresist 107 is applied entirely onto the silicon oxide film 106.

Referring to FIG. 29, the photoresist 107 is exposed to light using a photomask 110 having a pattern in which openings 111 (designated by the reference characters 111i to 111k in FIG. 29) are formed over respective regions wherein gate electrodes are to be formed, that is, using the photomask 110 having an opening pattern similar to a gate electrode layout pattern. The photomask 110 has a structure such that a light shielding film 109 is formed on a glass substrate 108. With reference to the top plan view labelled (A) in FIG. 29, the photomask 110 has a plurality of (in this case, as an example, three) openings 111i to 111k formed therein. The openings 111i and 111j are arranged adjacent to each other on the same line extending in a direction of a gate width (in the vertical direction of the figure).

FIG. 30 shows the photoresist 107 after being exposed to light in the step shown in FIG. 29. With reference to the top plan view labelled (A) in FIG. 30, the photoresist 107 has exposed portions 112 (designated by the reference characters 112i to 112k in FIG. 30) formed in corresponding relation to the openings 111 of the photomask 110.

Referring to FIG. 31, a portion (or an unexposed portion) of the photoresist 107 which is not exposed to light in the step shown in FIG. 29 or a portion of the photoresist 107 other than the exposed portions 112 is removed by development. Thus, only photoresists 113 (designated by the reference characters 113i to 113k in FIG. 31) corresponding to the exposed portions 112 are left on the silicon oxide film 106.

Referring to FIG. 32, the silicon oxide film 106 is patterned using the photoresists 113. More specifically, using the photoresists 113 as an etch mask, the silicon oxide film 106 is etched by an anisotropic dry etching process which exhibits a higher etch rate in a direction of depth of the silicon substrate 101. This removes a portion of the silicon oxide film 106 which is not covered with the photoresists 113, to expose an upper surface of the polysilicon film 105 under the portion. Only silicon oxide films 114 (designated by the reference characters 114i to 114k in FIG. 32) corresponding to the portions of the entirely formed silicon oxide film 106 which are covered with the photoresists 113 are left on the polysilicon film 105. Thereafter, the photoresists 113 are removed.

Referring to FIG. 33, using the silicon oxide films 114 as an etch mask (hard mask), the polysilicon film 105 and the silicon oxide film 104 are etched in the order named by an anisotropic dry etching process which exhibits a higher etch rate in the direction of depth of the silicon substrate 101. This removes portions of the polysilicon film 105 and the silicon oxide film 104 which are not covered with the silicon oxide films 114, to expose upper surfaces of the well 102 and the isolating insulation film 103 under the portions. With reference to the sectional view labelled (B) in FIG. 33, a gate structure 117 (designated by the reference character 117k in FIG. 33) having a multi-layer structure such that a silicon oxide film 116k, a polysilicon film 115k and the silicon oxide film 114k are stacked in the order named is formed on the well 102. The silicon oxide film 116k functions as a gate insulation film, and the polysilicon film 115k functions as a gate electrode. With reference to the top plan view labelled (A) in FIG. 33, gate structures 117i and 117j each having a multi-layer structure similar to the gate structure 117k are formed on the well 102 and the isolating insulation film 103. The reference numeral 117 is also used hereinafter to generically designate the gate structures 117i, 117j and 117k.

Thereafter, a silicon oxide film is formed entirely on the top surface by a CVD process, and is etched back by an anisotropic etching process, thereby forming sidewalls on the side surfaces of each of the gate structures 117. Next, an impurity is introduced into the upper surface of the well 102 by an ion implantation process to form a pair of source/drain regions on opposite sides of each of the gate structures 117. MOSFETs are formed by the above-mentioned process steps. Then, an interconnection step is performed, and a semiconductor device is thus completed.

In the background art method of manufacturing the semiconductor device as described above, the photoresist 107 is exposed to light in the step shown in FIG. 29, using the photomask 110 having the opening pattern similar to the gate electrode layout pattern. The photoresist 107 is developed to produce the photoresists 113, and the silicon oxide film 106 is patterned using the photoresists 113 to form the silicon oxide films 114. Then, etching is performed using the silicon oxide films 114 as a hard mask to form the gate structures 117.

Unfortunately, when the photoresist 107 is exposed to light in the step shown in FIG. 29, corners of the openings 111 are influenced by interference of light, which results in rounded corners of the exposed portions 112, as shown in FIG. 30. When a dimension of the openings 111 as measured in a direction of a gate length (in the horizontal direction in the figures) decreases with the decreasing size of the semiconductor device, a dimension of the exposed portions 112 becomes less than a dimension of the openings 111, as measured in the direction of the gate width. Since the shape of the exposed portions 112 is reflected finally in the shape of the gate structures 117, a finished dimension of the gate structures 117 is less than the dimension of the openings 111, as measured in the direction of the gate width. Thus, the background art method of manufacturing the semiconductor device has a problem such that the finished shape of the gate structures 117 recedes from the shape of the openings 111 of the photomask 110, as seen in the direction of the gate width, which results from the use of the single photomask 110 having the opening pattern similar to the gate electrode layout pattern for the exposure of the photoresist 107 to light. Such a problem deteriorates the performance of the MOSFETs because of variations in finished shape of the gate structures 117, or hinders the increase in level of integration of a semiconductor integrated circuit.

To solve the problem, a technique can be contemplated for designing a slightly greater dimension of the openings 111 as measured in the direction of the gate width, based on the predicted amount of receding of the gate structures 117. However, the prediction of the amount of receding requires repeated experiments. Additionally, when the openings 111*i* and 111*j* are adjacent to each other in the direction of the gate width as shown in FIG. 29, there is a limit to the amount of increase in the width of the openings 111*i* and 111*j*. Thus, this technique does not radically solve the problem with the background art method of manufacturing the semiconductor device.

SUMMARY OF THE INVENTION

It is an object of the present invention to provide a method of manufacturing a semiconductor device which can avoid the receding of the shape of a gate structure from the shape of an opening of a photomask, thereby forming the gate structure having dimensions as designed.

According to a first aspect of the present invention, the method of manufacturing a semiconductor device includes the following steps (a) to (l). The step (a) prepares a semiconductor substrate. The step (b) forms a first film on the semiconductor substrate, the first film being electrically conductive. The step (c) forms a second film on the first film. The step (d) forms a first photoresist on the second film. The step (e) exposes the first photoresist to light using a first photomask having a first pattern. The step (f) develops the first photoresist exposed in the step (e). The step (g) patterns the second film using the first photoresist developed in the step (f) to form a third film over a region in which a gate electrode is to be formed, the third film being wider than a gate width of the gate electrode. The step (h) is executed after the step (g). The step (h) forms a second photoresist on the first film to cover the third film. The step (i) exposes the second photoresist to light using a second photomask having a second pattern defining an end of the gate electrode as seen in a direction of the gate width. The step (j) develops the second photoresist exposed in the step (i). The step (k) patterns the third film using the second photoresist developed in the step (j) to form a fourth film. The step (l) etches the first film using the fourth film as an etch mask to form the gate electrode.

In the method, the third film wider than the gate width of the gate electrode is formed, and thereafter the end of the third film is removed to form the fourth film. Using the fourth film as an etch mask, the first film is etched to form the gate electrode. Therefore, the method can correctly set the gate width of the gate electrode.

According to a second aspect of the present invention, the method of manufacturing a semiconductor device includes the following steps (a) to (l). The step (a) prepares a semiconductor substrate. The step (b) forms a first film on the semiconductor substrate, the first film being electrically conductive. The step (c) forms a second film on the first film. The step (d) forms a first photoresist on the second film. The step (e) exposes the first photoresist to light using a first photomask having a first pattern. The step (f) develops the first photoresist exposed in the step (e). The step (g) patterns the second film using the first photoresist developed in the step (f) to form a third film extending continuously from over a region in which a first gate electrode is to be formed to over a region in which a second gate electrode is to be formed, the first gate electrode and the second gate electrode being arranged adjacent to each other in a direction of a gate width. The step (h) is executed after the step (g). The step (h) forms a second photoresist on the first film to cover the third film. The step (i) exposes the second photoresist to light using a second photomask having a second pattern defining an end of the first gate electrode which is closer to the second gate electrode and an end of the second gate electrode which is closer to the first gate electrode. The step (j) develops the second photoresist exposed in the step (i). The step (k) patterns the third film using the second photoresist developed in the step (j) to form a fourth film. The step (l) etches the first film using the fourth film as an etch mask to form the first and second gate electrodes.

In the method, the third film is formed extending continuously from over the region in which the first gate electrode is to be formed to over the region in which the second gate electrode is to be formed, and is then patterned to form the fourth film. Using the fourth film as an etch mask, the first film is etched to form the first and second gate electrodes. This allows a distance between the first and second gate electrodes to be set to a minimum line width. Consequently, a high level of integration of the semiconductor device is achieved.

Preferably, the method further includes the following step (m). The step (m) is executed after the step (g). The step (m) thins the third film by etching.

The method provides a shorter gate length of the finally obtained gate electrode to achieve a higher speed operation of the semiconductor device.

Preferably, the step (m) is executed before the step (k).

The method can avoid gate width variations resulting from etching of the fourth film in an isotropic etching process for thinning the third film.

Preferably, the method is applied to formation of gate electrodes of respective transistors constituting an SRAM memory cell.

The method can achieve the size reduction of the SRAM memory cell.

Preferably, the method is applied to formation of gate electrodes of respective memory cell transistors in a memory cell array.

The method can achieve the size reduction of the memory cell array.

Preferably, the method is applied to formation of gate electrodes of respective transistors in a macrocell region.

The method can achieve the size reduction of the macrocell region.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 through 13 show a method of manufacturing a semiconductor device in order of process steps according to a first preferred embodiment of the present invention;

FIGS. 14 through 21 show a method of manufacturing a semiconductor device in order of process steps according to a second preferred embodiment of the present invention;

FIG. 25 is a top plan view showing a configuration of another memory cell array according to the fifth preferred embodiment of the present invention;

FIG. 26 is a top plan view showing a layout configuration of a macrocell region according to a sixth preferred embodiment of the present invention.

DESCRIPTION OF THE PREFERRED EMBODIMENTS

First Preferred Embodiment

FIGS. 1 through 13 show a method of manufacturing a semiconductor device in order of process steps according to a first preferred embodiment of the present invention. In FIGS. 1 through 13, top plan views are labelled (A), and sectional views showing sectional structures taken along a line X1—X1 in the top plan views are labelled (B).

Figure 1:
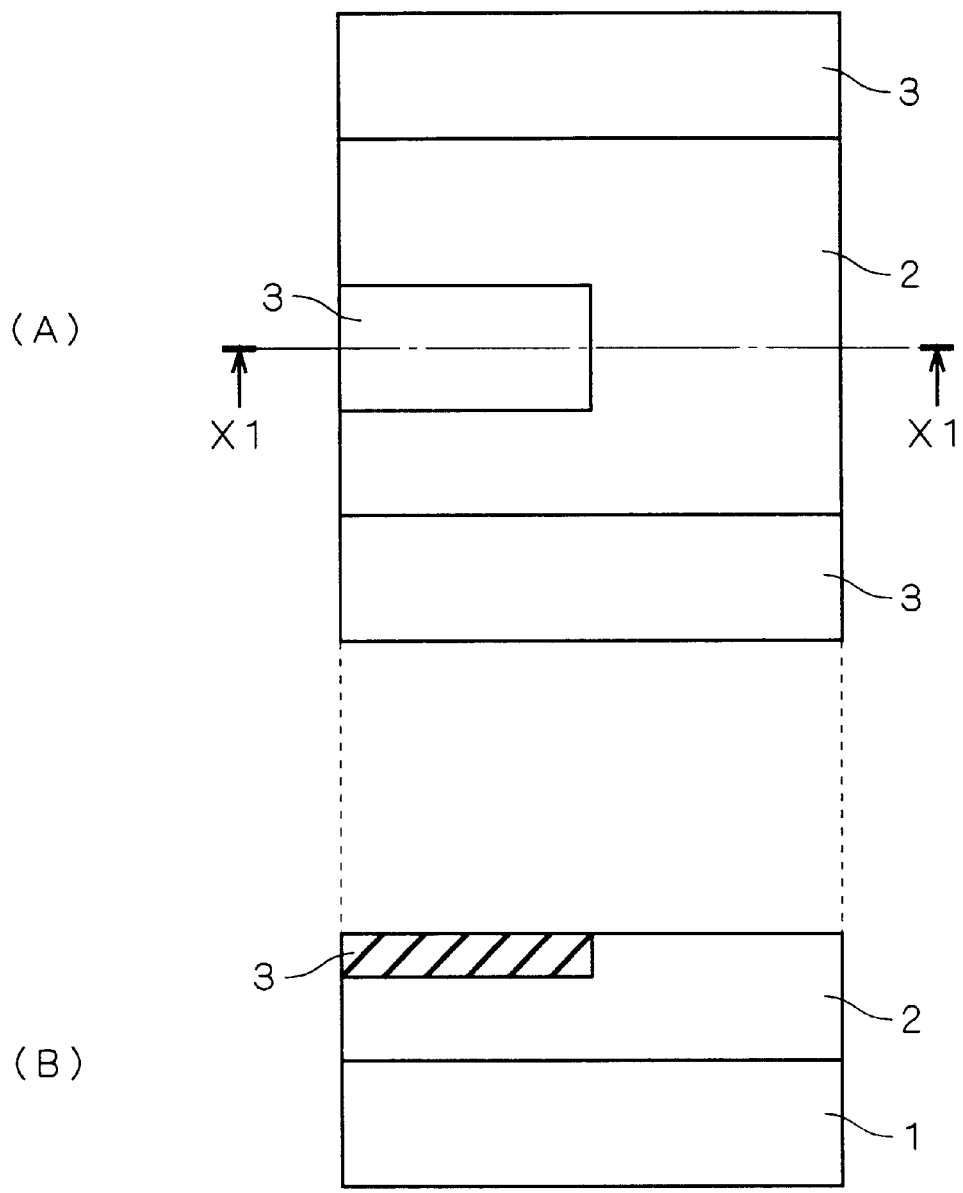

With reference to FIG. 1, an impurity is initially introduced into an upper surface of a silicon substrate 1 to form a well 2. In this step, a p well is formed when a p type impurity such as phosphorus is introduced, and an n well is formed when an n type impurity such as boron is introduced. Next, a trench-type isolating insulation film 3 made of silicon oxide or the like is partially formed in the upper surface of the silicon substrate 1 by a known trench isolation technique. Referring to the top plan view labelled (A) in FIG. 1, a portion in which the isolating insulation film 3 is not formed serves as a device formation region for formation of a MOSFET. In other words, the device formation region is defined by the isolating insulation film 3.

Referring to FIG. 2, a silicon oxide film 4 is formed entirely on the well 2 and the isolating insulation film 3 by a CVD process using TEOS as a source gas. Next, a polysilicon film 5 is formed entirely on the silicon oxide film 4 by a CVD process. Then, a silicon oxide film 6 is formed entirely on the polysilicon film 5 by a thermal oxidation process or a CVD process using TEOS as a source gas. Next, a positive photoresist 7 is applied entirely onto the silicon oxide film 6. Other insulation films such as a silicon oxynitride film (SiON) and a ferroelectric film ($TiO_2$, $Ta_2O_5$ or the like) may be formed in place of the silicon oxide films 4 and 6.

Figure 3:
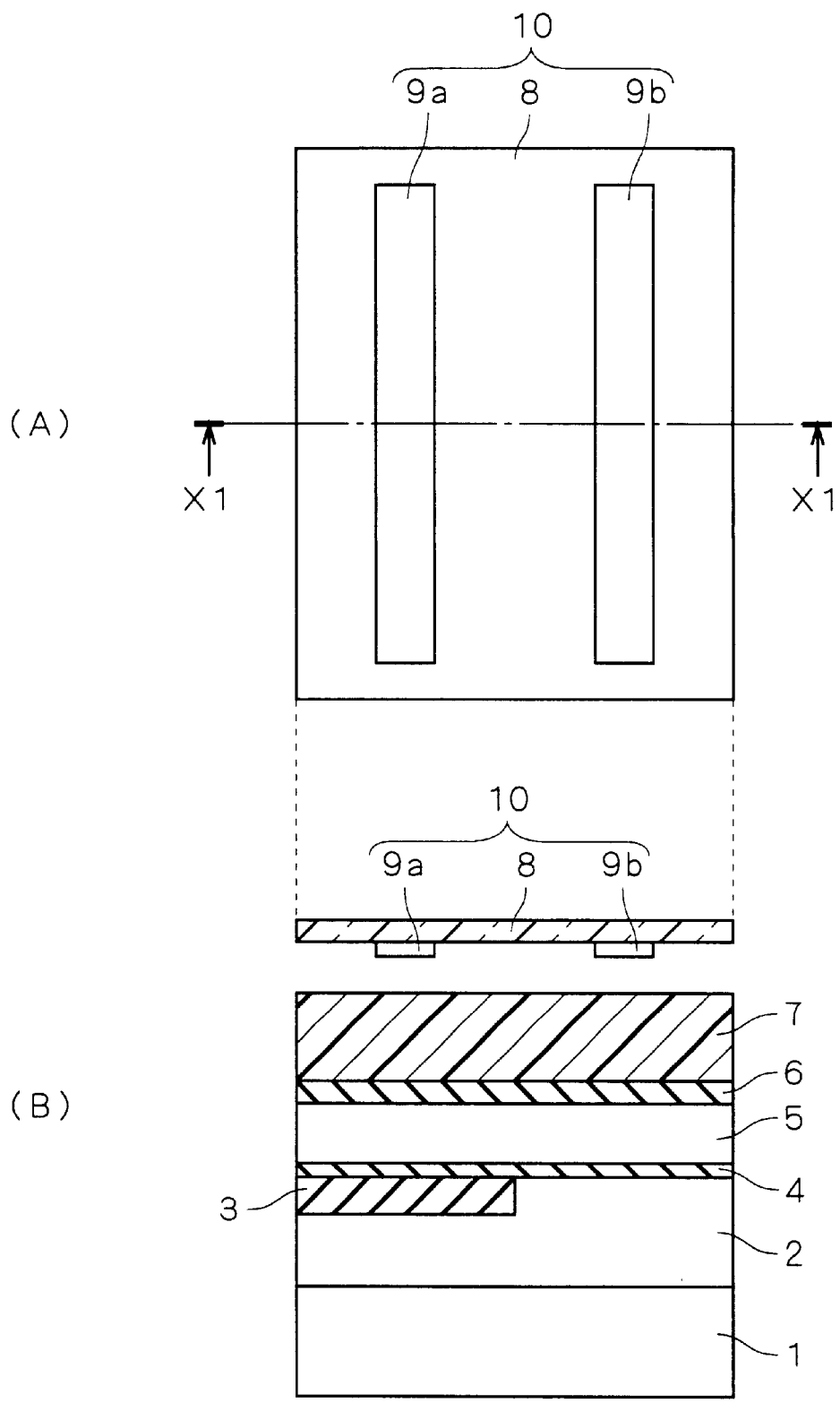

Referring to FIG. 3, the photoresist 7 is exposed to light using a photomask 10 having a predetermined light shielding pattern. The photomask 10 has a structure such that a plurality of (in this case, as an example, two) light shielding films 9a and 9b are formed on a glass substrate 8. It should be noted that the shape of the light shielding films 9a and 9b does not coincide with the final shape of gate structures.

Figure 13:
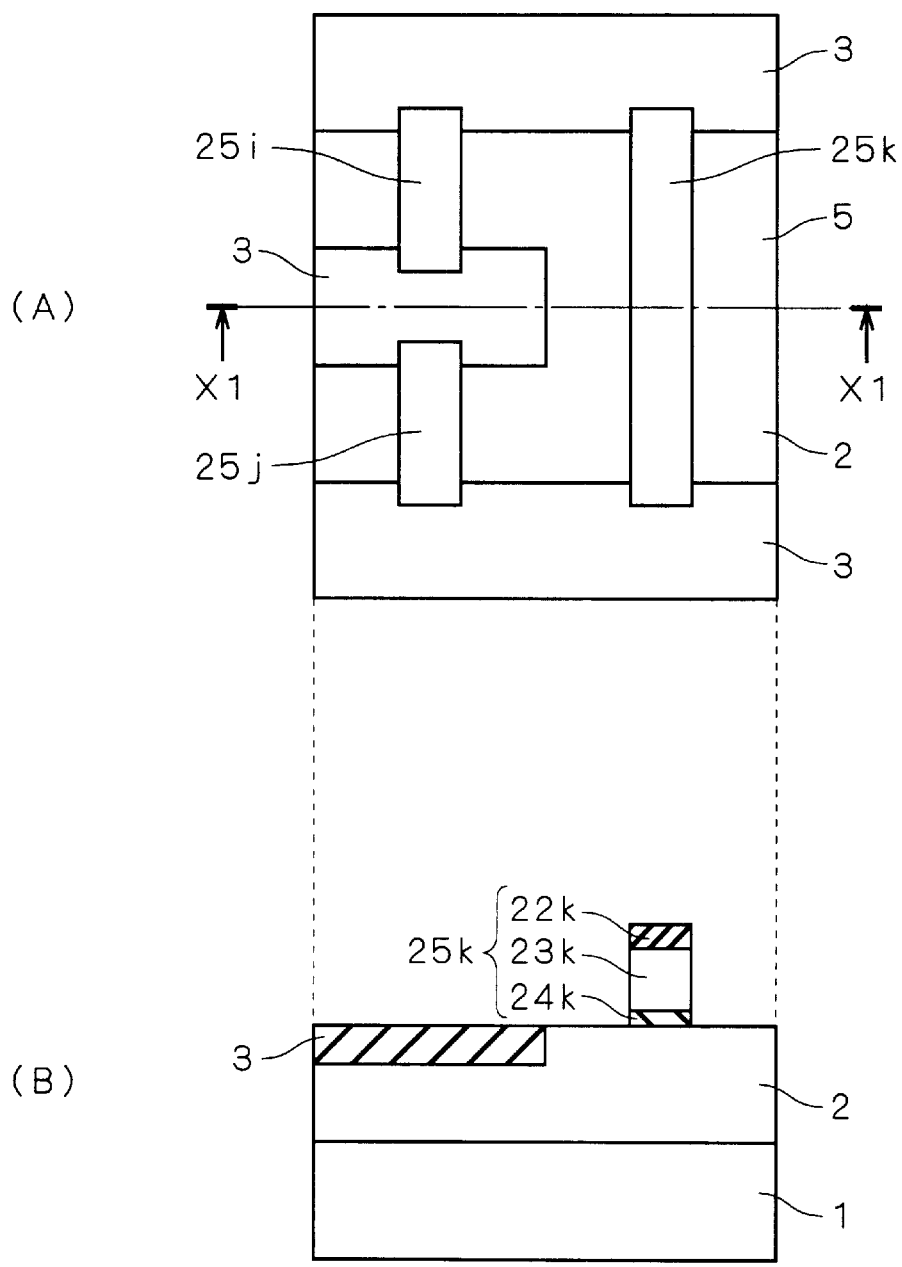

A final MOSFET structure is shown in FIG. 13. A comparison between the top plan views labelled (A) in FIGS. 3 and 13 shows that a dimension of the light shielding films 9a and 9b as measured in a direction of a gate length (in the horizontal direction of the figures) is equal to the gate length of gate structures 25i to 25k. The light shielding film 9b is formed over a region in which the gate structure 25k is to be formed, and a dimension of the light shielding film 9b as measured in a direction of a gate width (in the vertical direction of the figures) is greater than the gate width of the gate structure 25k. In other words, the light shielding film 9b is formed extending to the outside of the opposite ends of the gate structure 25k as viewed in the direction of the gate width. The light shielding film 9a is formed over the gate structures 25i and 25j, and extends continuously from over a region in which the gate structure 25i is to be formed to over a region in which the gate structure 25j is to be formed. Additionally, the light shielding film 9a is formed extending to the outside of outer ends of the respective gate structures 25i and 25j as viewed in the direction of the gate width. With reference to the top plan view labelled (A) in FIG. 13, the gate structures 25i and 25j are arranged adjacent to each other on the same line extending in the direction of the gate width.

Figure 4:
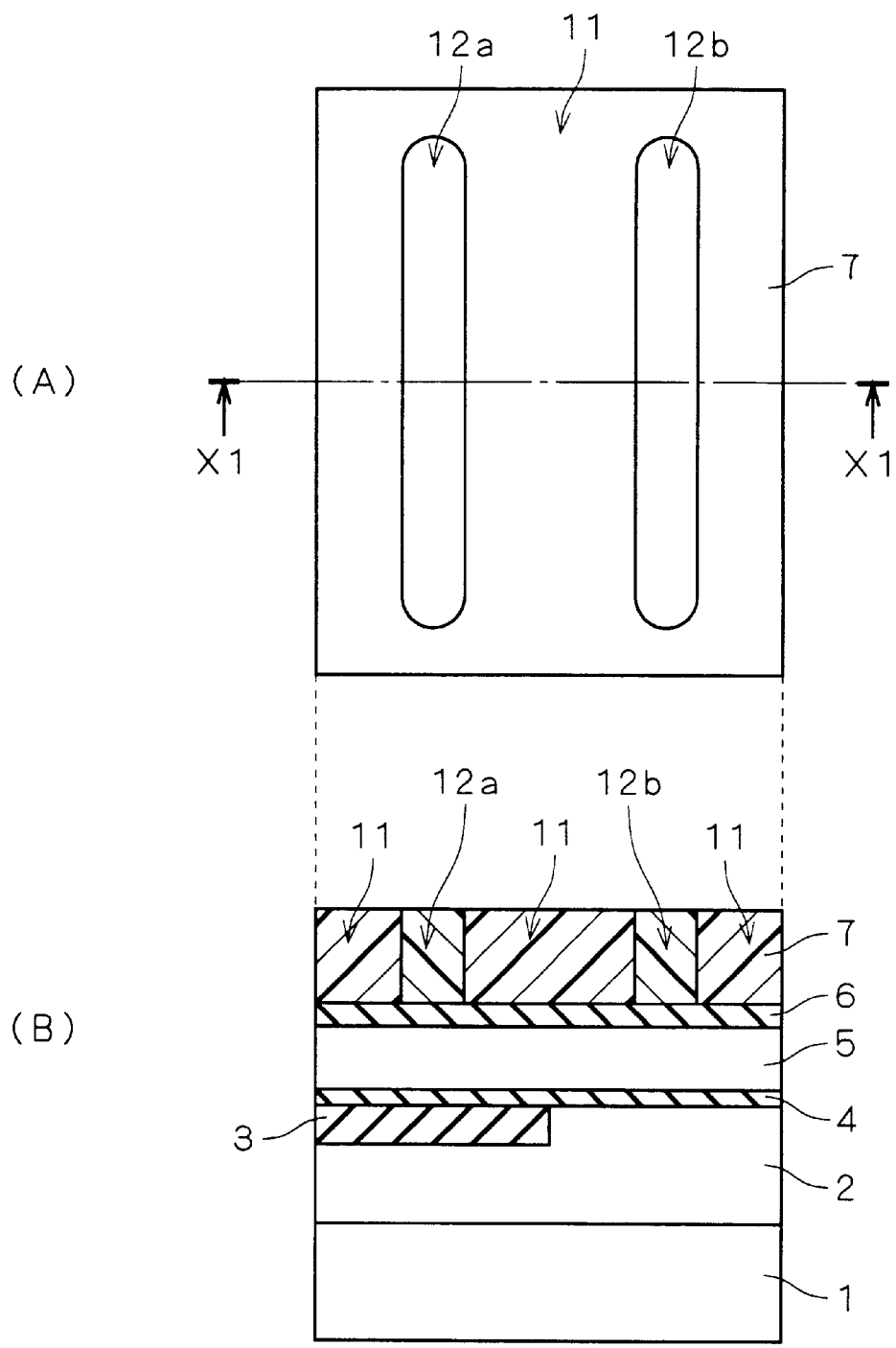

FIG. 4 shows the photoresist 7 after being exposed to light in the step shown in FIG. 3. With reference to the top plan view labelled (A) in FIG. 4, the photoresist 7 has unexposed portions 12a and 12b formed in corresponding relation to the light shielding films 9a and 9b of the photomask 10. Other portions of the photoresist 7 than the unexposed portions 12a and 12b become an exposed portion 11. When the photoresist 7 is exposed to light in the step shown in FIG. 3, corners of the light shielding films 9a and 9b are influenced by interference of light, which results in rounded corners of the unexposed portions 12a and 12b, as shown in the top plan view labelled (A) in FIG. 4.

Figure 5:
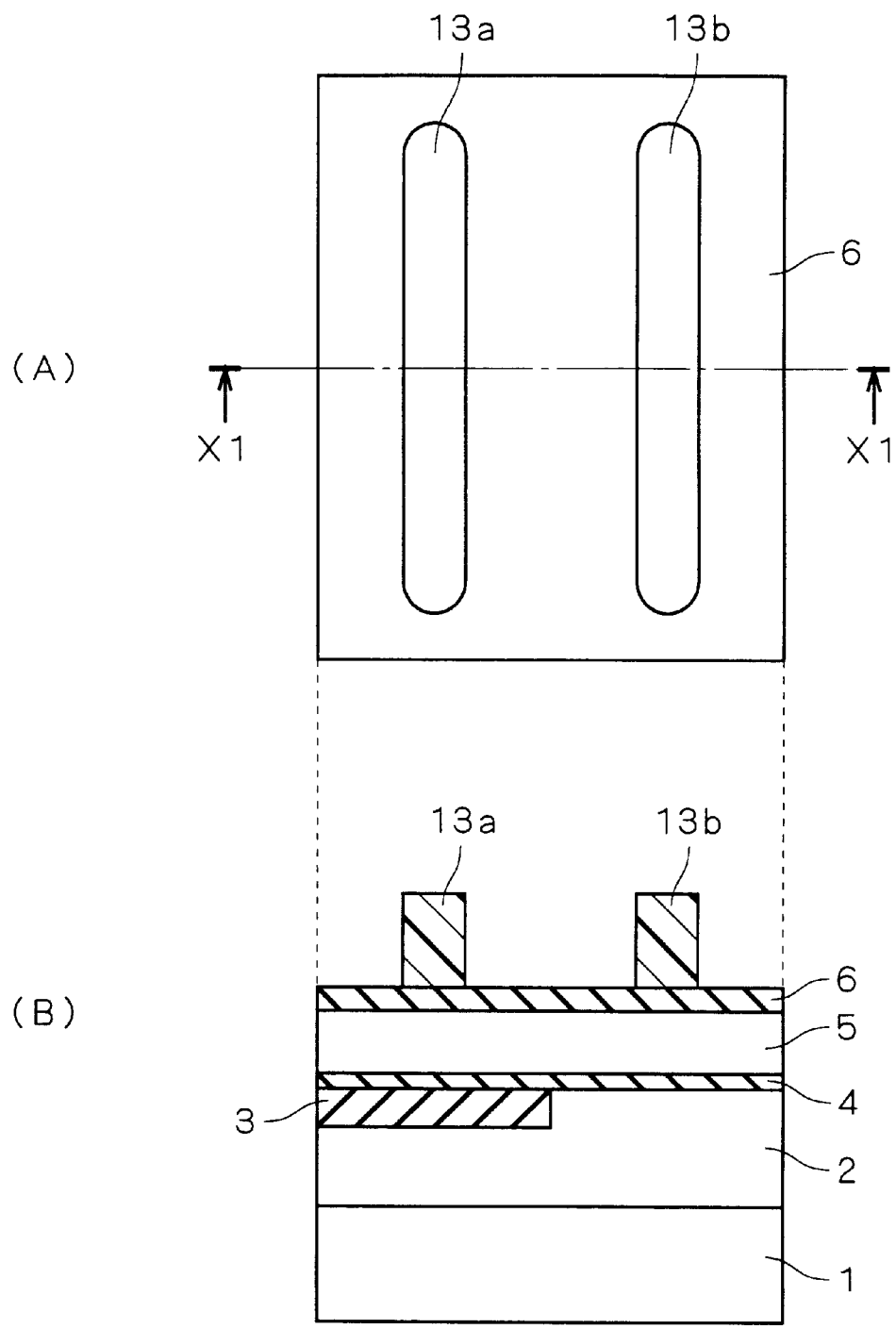

Referring to FIG. 5, the exposed portion 11 of the photoresist 7 is removed by development. Thus, only photoresists 13a and 13b corresponding to the unexposed portions 12a and 12b are left on the silicon oxide film 6.

Figure 6:
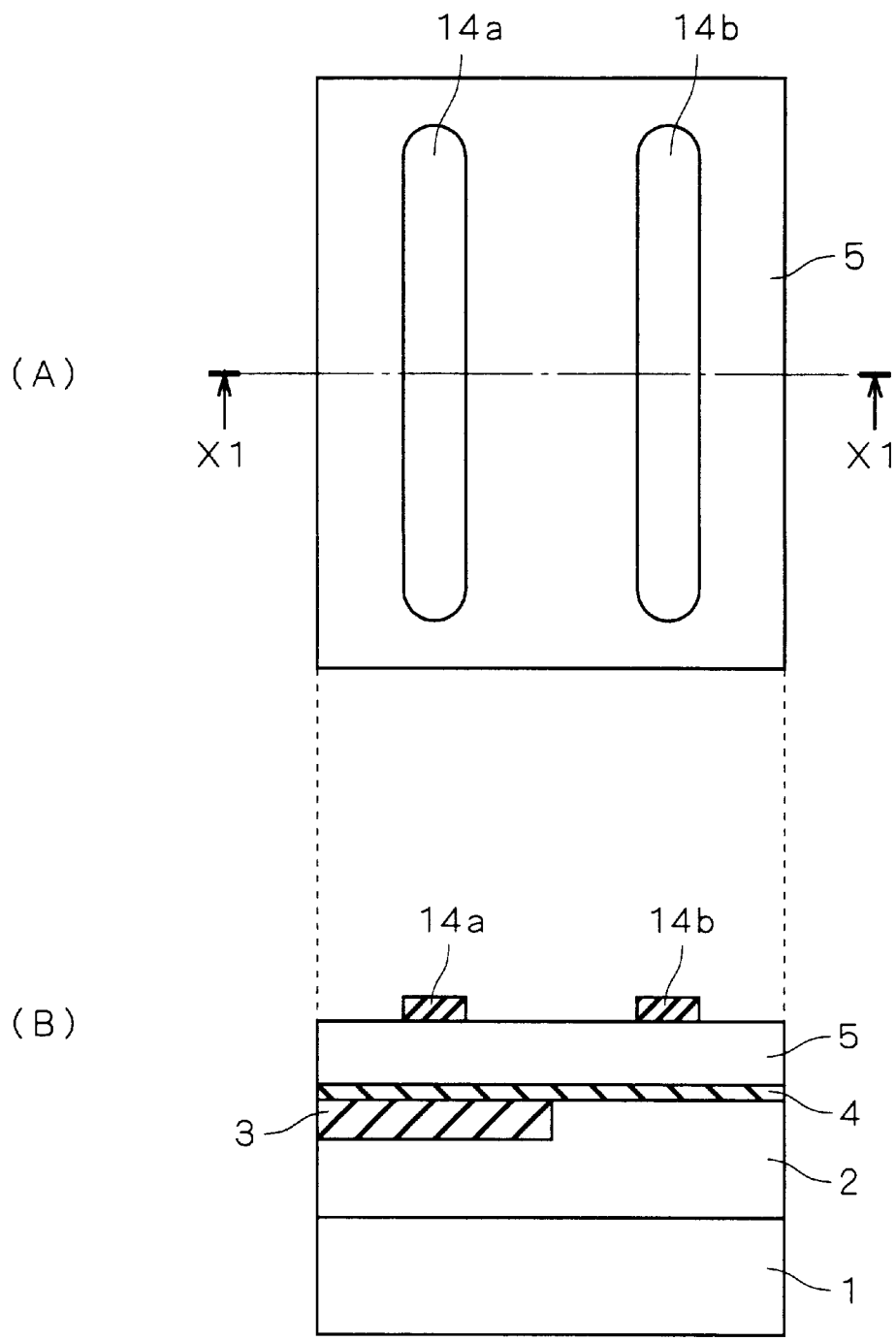

Referring to FIG. 6, the silicon oxide film 6 is patterned using the photoresists 13a and 13b. More specifically, using the photoresists 13a and 13b as an etch mask, the silicon oxide film 6 is etched by an anisotropic dry etching process which exhibits a higher etch rate in a direction of depth of the silicon substrate 1. This removes a portion of the silicon oxide film 6 which is not covered with the photoresists 13a and 13b, to expose an upper surface of the polysilicon film 5 under the portion. Only silicon oxide films 14a and 14b corresponding to the portions of the entirely formed silicon oxide film 6 which are covered with the photoresists 13a and 13b are left on the polysilicon film 5. Thereafter, the photoresists 13a and 13b are removed.

Figure 7:
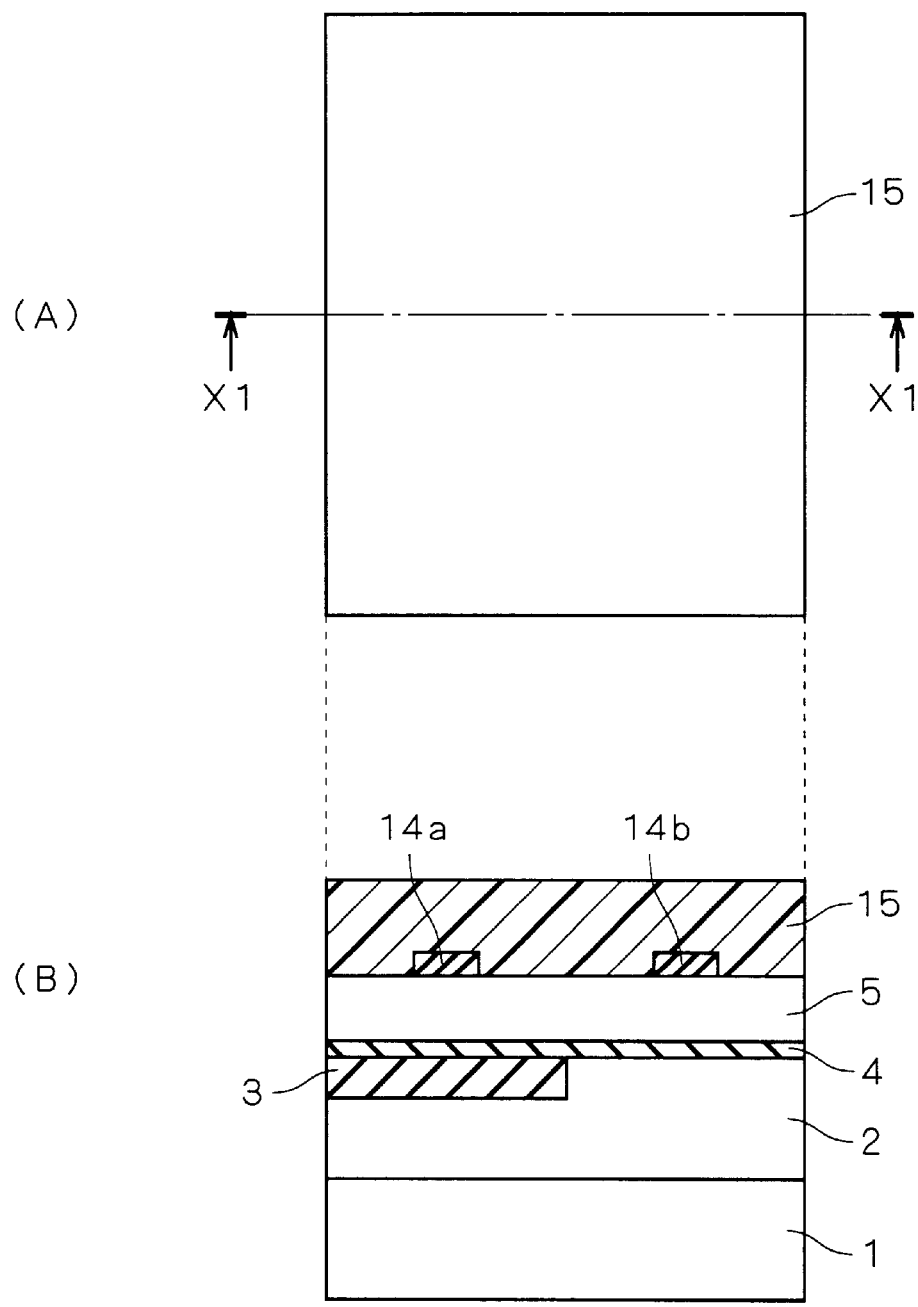

Referring to FIG. 7, a positive photoresist 15 is applied entirely onto the polysilicon film 5 so as to cover the silicon oxide films 14a and 14b. Next, with reference to FIG. 8, the photoresist 15 is exposed to light using a photomask 18 having a predetermined opening pattern. The photomask 18 has a structure such that a light shielding film 17 is formed on a glass substrate 16. With reference to the top plan view labelled (A) in FIG. 8, the photomask 18 has a plurality of (in this case, as an example, three) openings 19 (designated by the reference characters 19s to 19u in FIG. 8) formed therein. It should be noted that the shape of the openings 19 does not coincide with the final shape of the gate structures.

Figure 8:
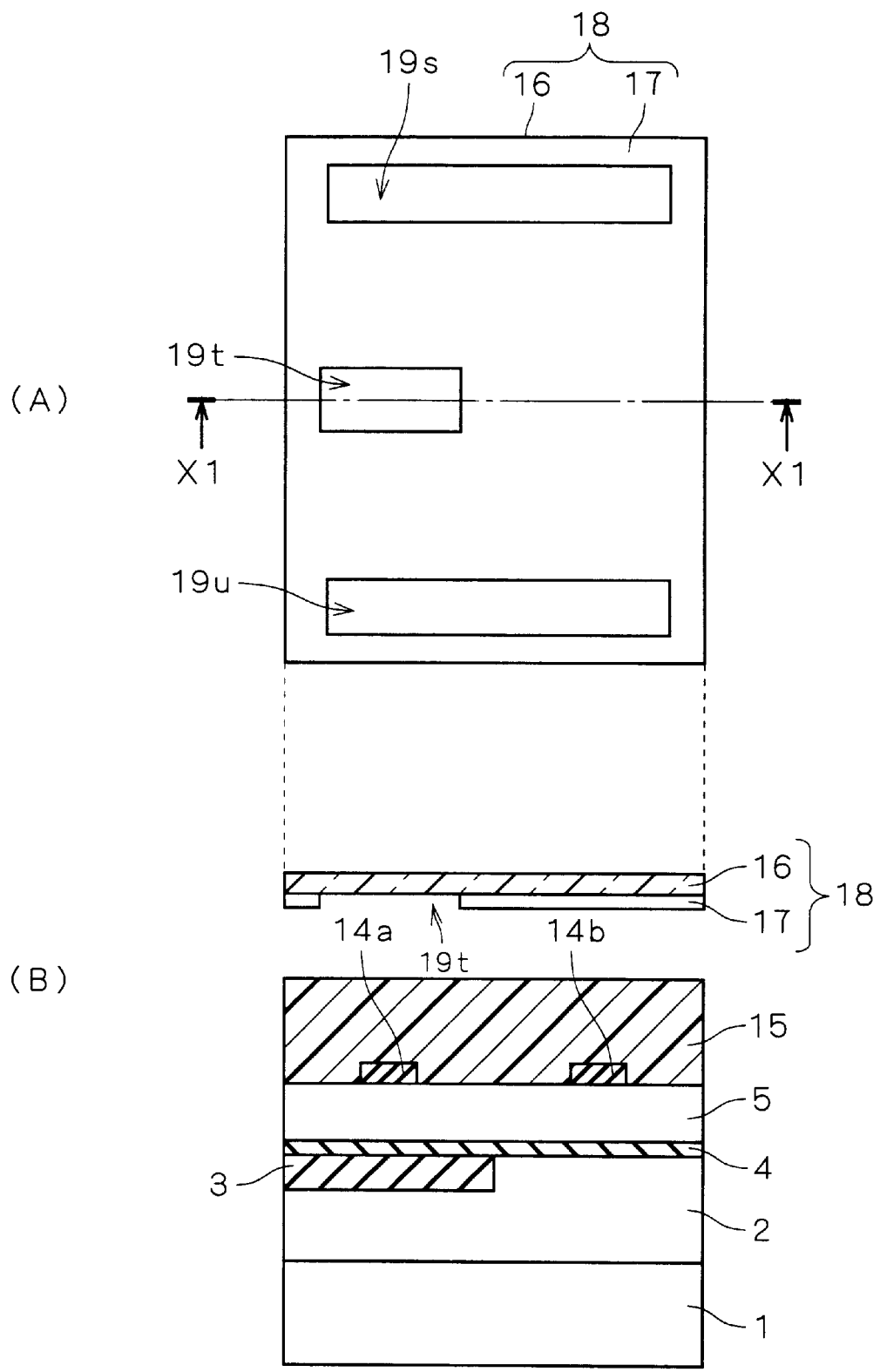

A comparison between the top plan views labelled (A) in FIGS. 8 and 13 shows that the upper ends of the respective gate structures 25i and 25k as viewed in the direction of the gate width are defined by the lower side of the opening 19s, that the lower ends of the respective gate structures 25j and 25k are defined by the upper side of the opening 19u, and that the lower end of the gate structure 25i and the upper end of the gate structure 25j are defined respectively by the upper and lower sides of the opening 19t. In other words, the photomask 18 has an opening pattern for defining the ends of the respective gate structures 25i to 25k as viewed in the direction of the gate width.

Figure 9:
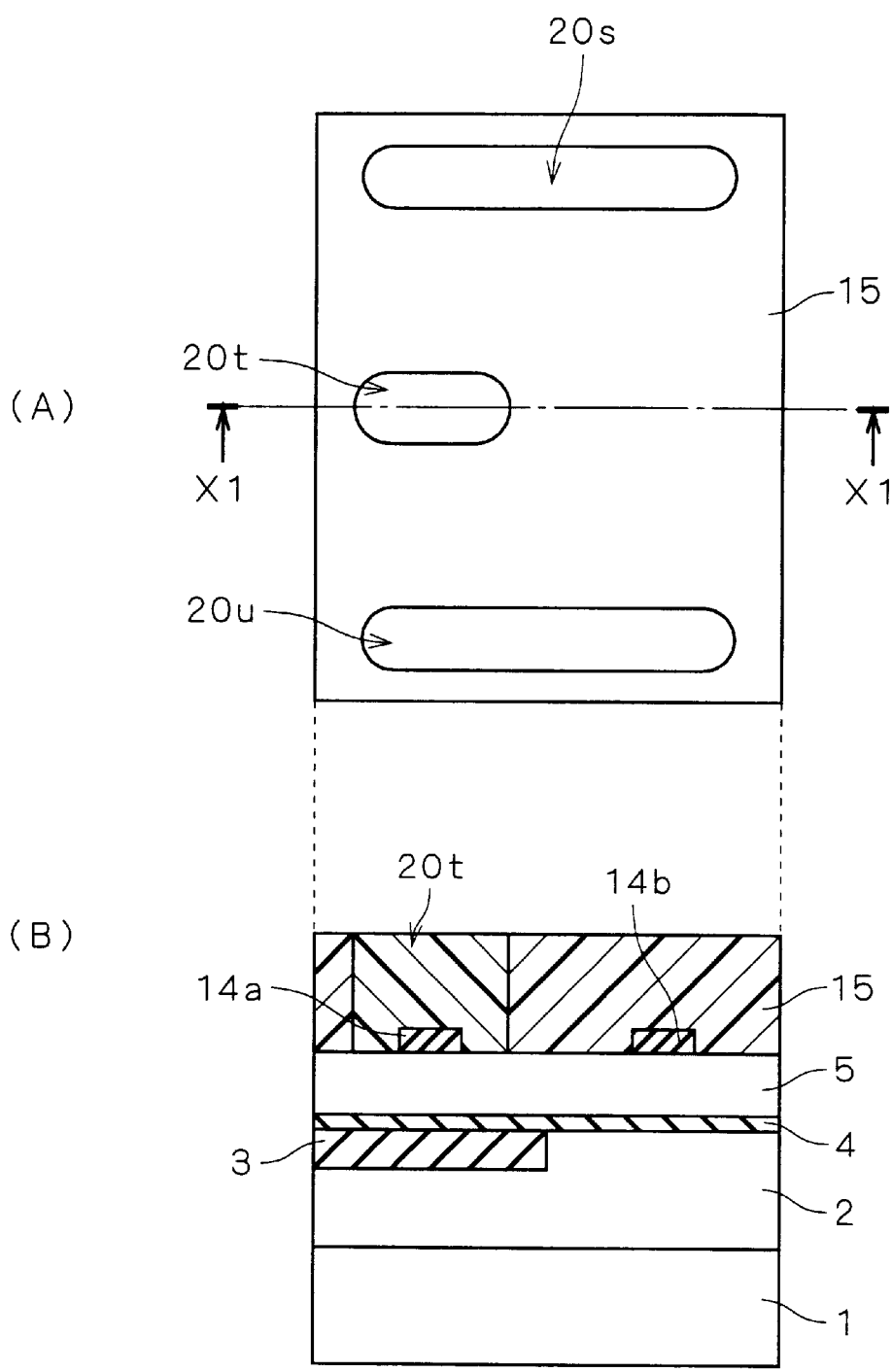

FIG. 9 shows the photoresist 15 after being exposed to light in the step shown in FIG. 8. With reference to the top plan view labelled (A) in FIG. 9, the photoresist 15 has exposed portions 20 (designated by the reference characters 20s to 20u in FIG. 9) formed in corresponding relation to the openings 19 of the photomask 18. When the photoresist 15 is exposed to light in the step shown in FIG. 8, corners of the openings 19 are influenced by interference of light, which results in rounded corners of the exposed portions 20, as shown in the top plan view labelled (A) in FIG. 9.

Figure 10:
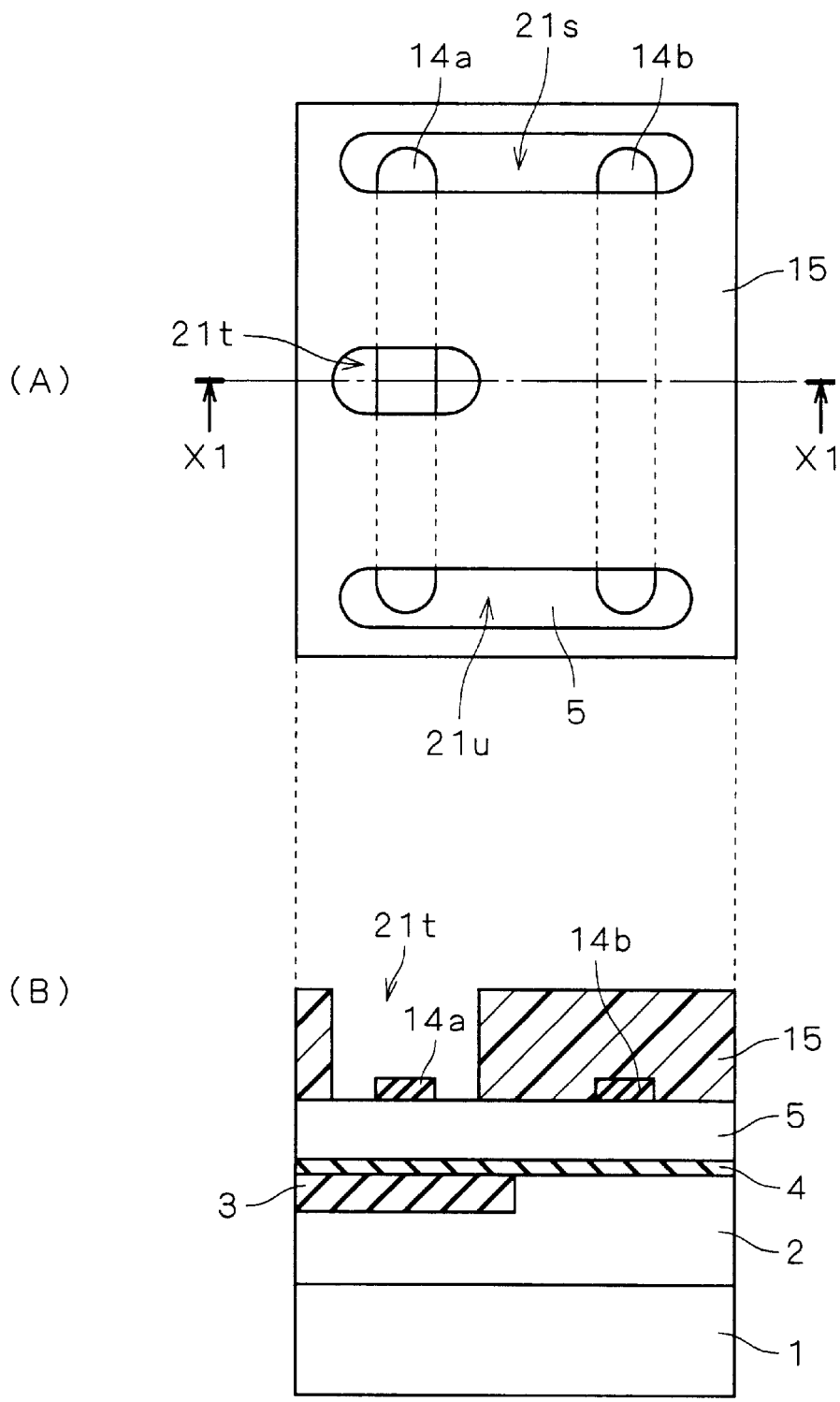

Referring to FIG. 10, the exposed portions 20 of the photoresist 15 are removed by development. Thus, openings 21s to 21u corresponding respectively to the exposed portions 20s to 20u are formed in the photoresist 15. In the opening 21s, upper end portions of the respective silicon oxide films 14a and 14b are exposed. In the opening 21u, lower end portions of the respective silicon oxide films 14a and 14b are exposed. In the opening 21t, a middle portion of the silicon oxide film 14a is exposed.

Figure 11:
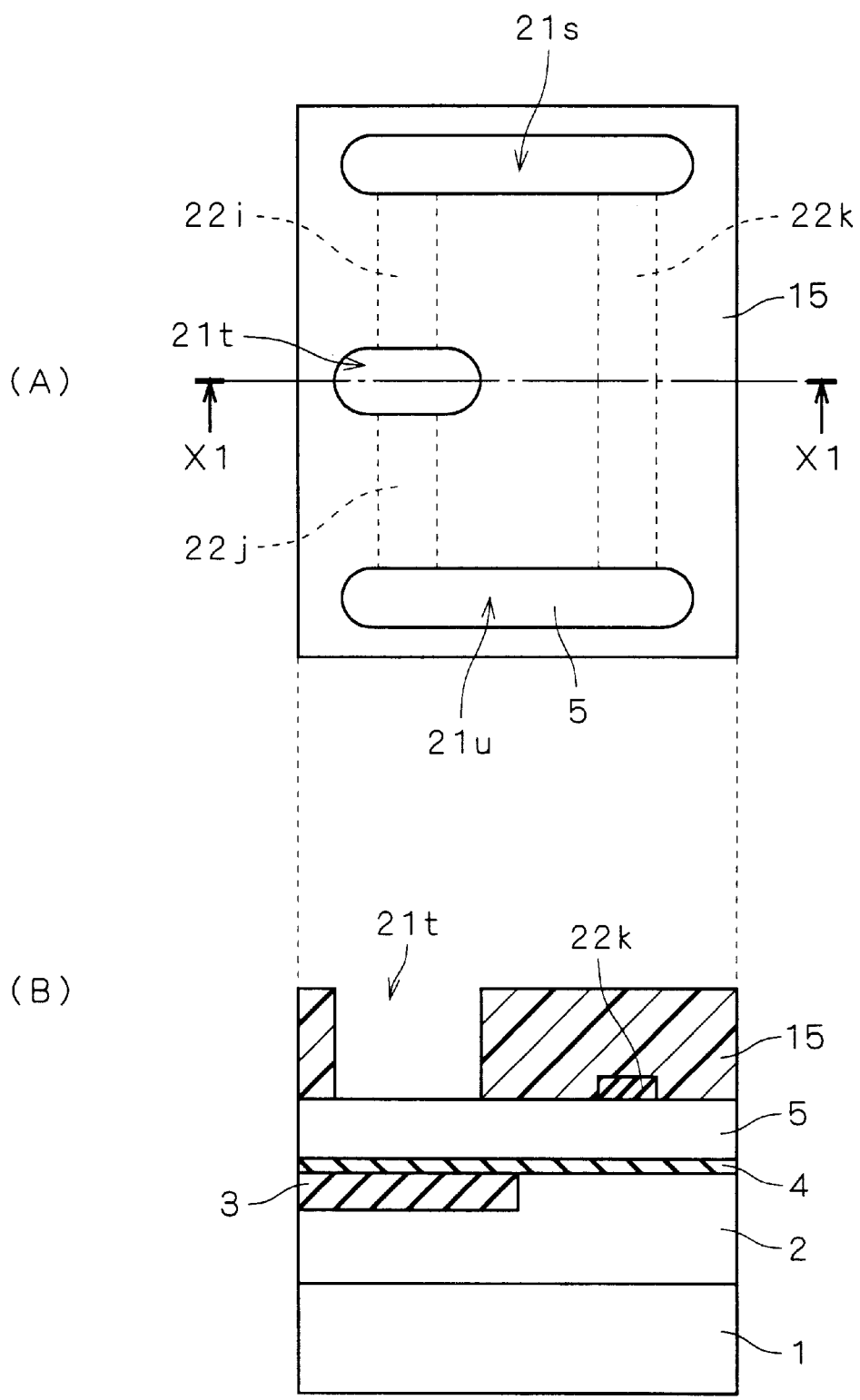

Referring to FIG. 11, using the photoresist 15 as an etch mask, the portions of the silicon oxide films 14a and 14b which are exposed in the openings 21s to 21u are etched away. Portions of the silicon oxide films 14a and 14b which are covered with the photoresist 15 are not etched away by this etching process but are left as silicon oxide films 22 (designated by the reference characters 22i to 22k in FIG. 11).

Figure 12:
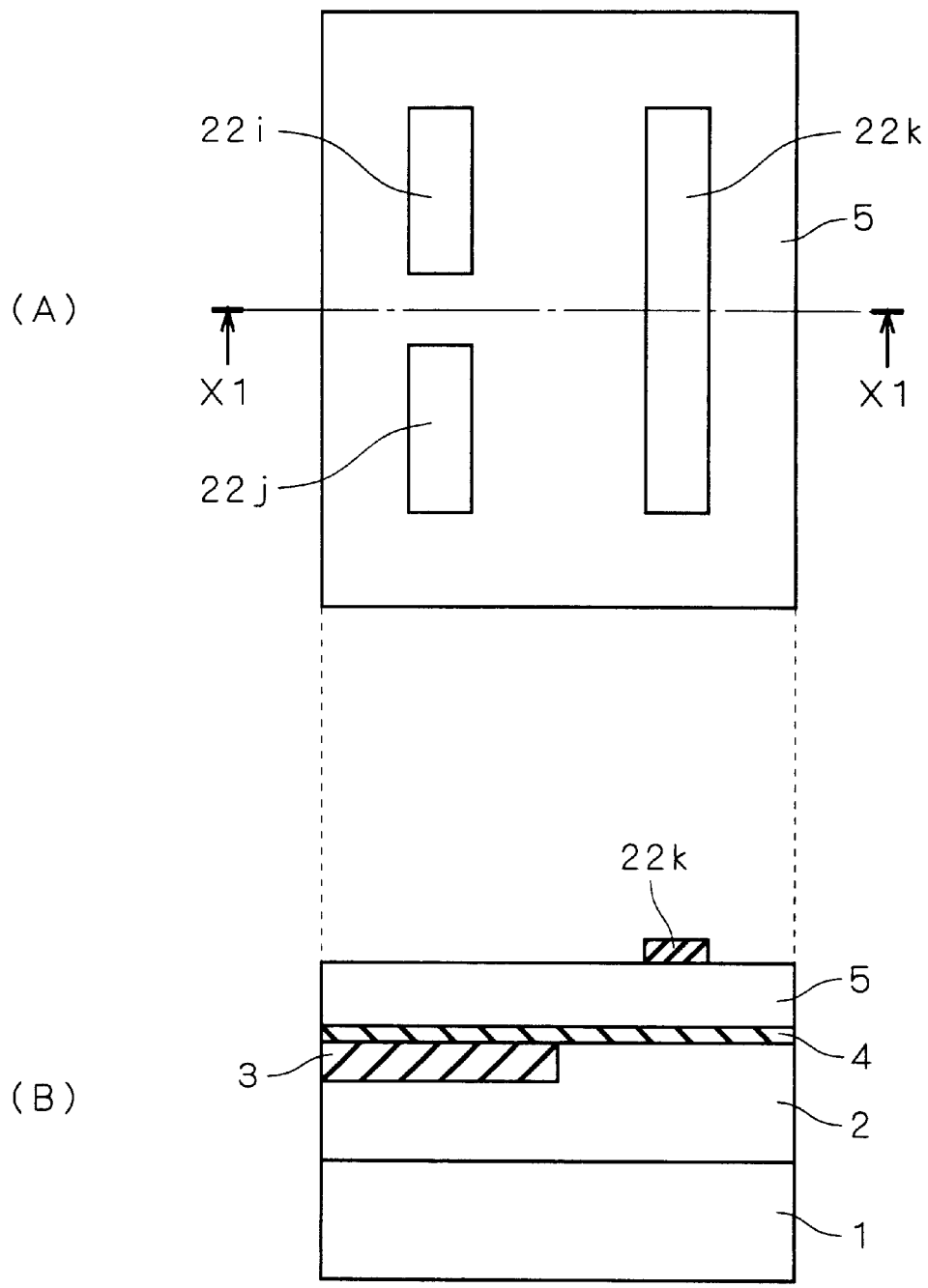

Referring to FIG. 12, the photoresist 15 is removed. The silicon oxide films 22i to 22k remain formed on the polysilicon film 5 over the regions in which the gate structures 25i to 25k are to be formed, respectively.

Referring to FIG. 13, using the silicon oxide films 22 as an etch mask (hard mask), the polysilicon film 5 and the silicon oxide film 4 are etched in the order named by an anisotropic dry etching process which exhibits a higher etch rate in the direction of depth of the silicon substrate 1. This removes portions of the polysilicon film 5 and the silicon oxide film 4 which are not covered with the silicon oxide films 22, to expose upper surfaces of the well 2 and the isolating insulation film 3 under the portions.

With reference to the sectional view labelled (B) in FIG. 13, the gate structure 25 (designated by the reference character 25k in FIG. 13) having a multi-layer structure such that a silicon oxide film 24k, a polysilicon film 23k and the silicon oxide film 22k are stacked in the order named is formed on the well 2. The silicon oxide film 24k functions as a gate insulation film, and the polysilicon film 23k functions as a gate electrode. With reference to the top plan view labelled (A) in FIG. 13, the gate structures 25i and 25j each having a multi-layer structure similar to the gate structure 25k are formed on the well 2 and the isolating insulation film 3. The reference numeral 25 is also used hereinafter to generically designate the gate structures 25i, 25j and 25k.

Thereafter, a silicon oxide film is formed entirely on the top surface by a CVD process, and is etched back by an anisotropic etching process, thereby forming sidewalls on the side surfaces of each of the gate structures 25. Next, an impurity is introduced into the upper surface of the well 2 by an ion implantation process to form a pair of source/drain regions on opposite sides of each of the gate structures 25. MOSFETs are formed by the above-mentioned process steps. Then, an interconnection step is performed, and a semiconductor device is thus completed.

In the above description, the exposure of the photoresist 7 to light in the step shown in FIG. 3 is followed by the development of the photoresist 7 (FIG. 5) and the etching of the silicon oxide film 6 (FIG. 6). Thereafter, the exposure of the photoresist 15 to light in the step shown in FIG. 8 is followed by the development of the photoresist 15 (FIG. 10) and the etching of the silicon oxide films 14a and 14b (FIG. 11). Alternatively, the exposure of the photoresist 7 using the photomask 10 may be immediately followed by the exposure of the photoresist 7 using the photomask 18, and thereafter the development of the photoresist 7 and the etching of the silicon oxide film 6 may be performed once. Such a method can also form the silicon oxide films 22 similar in structure to those shown in FIG. 12.

In the method of manufacturing the semiconductor device according to the first preferred embodiment, as described hereinabove, the silicon oxide film 14b wider than the gate width of the gate structure 25k is formed, and thereafter the end portions of the silicon oxide film 14b are removed to form the silicon oxide film 22k. Then, the gate structure 25k is formed by the etching using the silicon oxide film 22k as the hard mask. Therefore, this method can correctly set the gate width of the gate structure 25k to a dimension equal to a distance between the lower side of the opening 19s and the upper side of the opening 19u of the photomask 18.

Further, the silicon oxide film 14a is formed extending from over the region in which the gate structure 25i is to be formed to over the region in which the gate structure 25j is to be formed, and thereafter the middle portion of the silicon oxide film 14a is removed to separate the silicon oxide film 14a into the silicon oxide film 22i and the silicon oxide film 22j. Then, the gate structures 25i and 25j are formed by the etching using the silicon oxide films 22i and 22j as the hard mask. Therefore, this method can set a distance between the gate structures 25i and 25j to a dimension equal to a distance (or minimum line width) between the upper and lower sides of the opening 21t of the photomask 18. Consequently, a high level of integration of a semiconductor integrated circuit is achieved.

A method of manufacturing a semiconductor device for the purpose of suppressing the receding of the tips of a gate electrode resulting from interference of light is disclosed in Japanese Patent Application Laid-Open No. 9-289153 (1997). This method comprises the steps of: (a) forming a gate oxide film and a gate electrode in the order named on a silicon substrate; (b) forming a first photoresist on the gate electrode; (c) exposing the first photoresist to light using a first photomask; (d) developing the first photoresist; (e) etching the gate electrode using the developed first photoresist as an etch mask; (f) forming a second photoresist; (g) exposing the second photoresist to light using a second photomask; (h) developing the second photoresist; and (i) etching the gate electrode using the developed second photoresist as an etch mask, the steps (a) through (i) being performed in the order named.

In this method, the gate electrode is etched in the steps (e) and (i). The overetching in the two etching steps causes respective damages to the silicon substrate. On the other hand, in the method of manufacturing the semiconductor device according to the first preferred embodiment, the silicon substrate 1 is damaged only once by overetching in the etching step shown in FIG. 13. Therefore, the method according to the first preferred embodiment produces the excellent effect of reducing the damages to the silicon substrate, as compared with the method disclosed in Japanese Patent Application Laid-Open No. 9-289153.

Second Preferred Embodiment

FIGS. 14 through 21 show a method of manufacturing a semiconductor device in order of process steps according to a second preferred embodiment of the present invention. In FIGS. 14 through 21, top plan views are labelled (A), and sectional views showing sectional structures taken along the line X1—X1 in the top plan views are labelled (B).

First, similar steps to those of the method according to the first preferred embodiment are performed to produce the structure shown in FIG. 6. Next, with reference to FIG. 14, the entire silicon oxide films 14a and 14b are etched by a predetermined amount by an isotropic etching process, e.g. a wet etching process using hydrofluoric acid. This makes the silicon oxide films 14a and 14b thinner to form silicon oxide films 30a and 30b.

Figure 15:
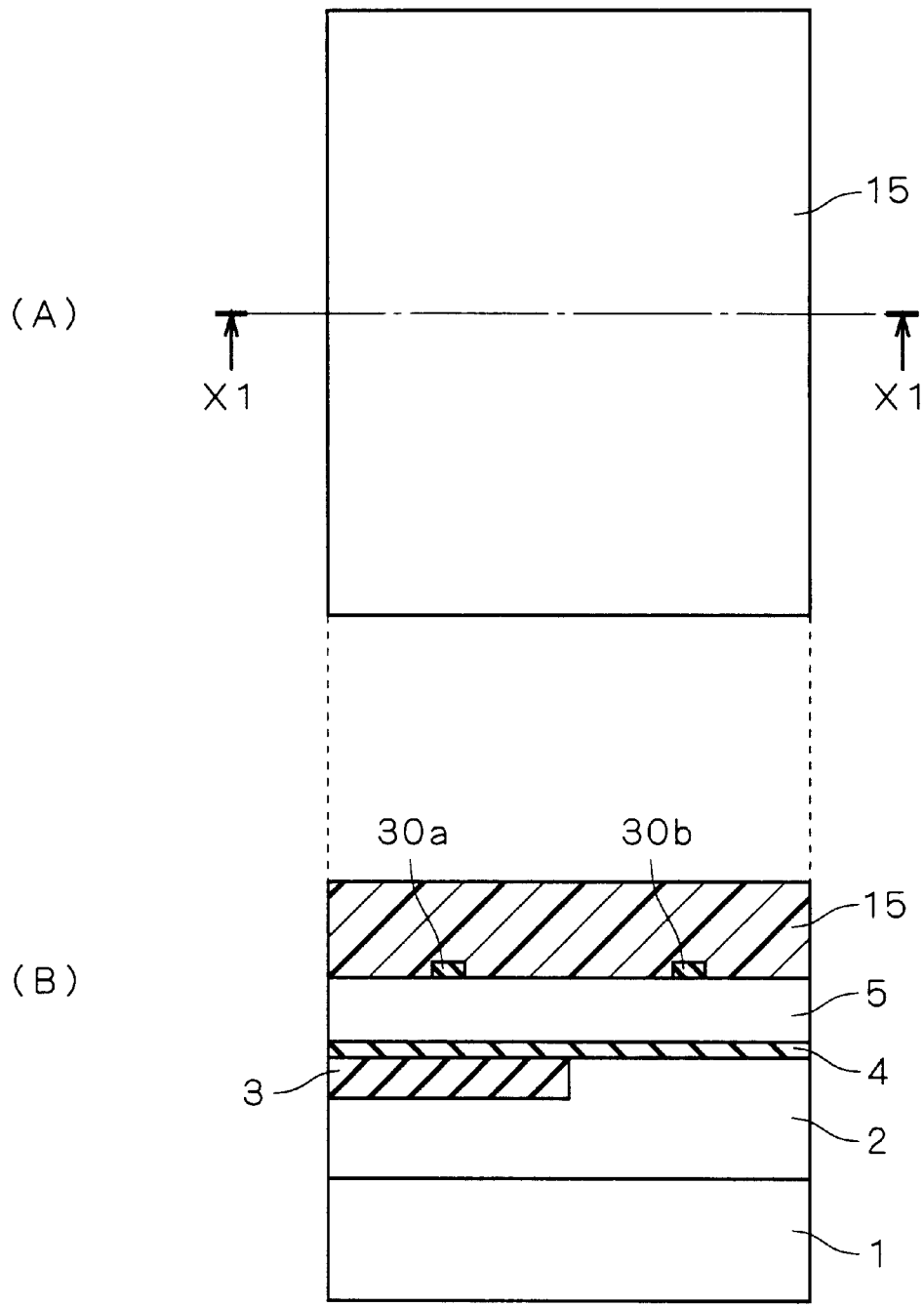
Figure 16:
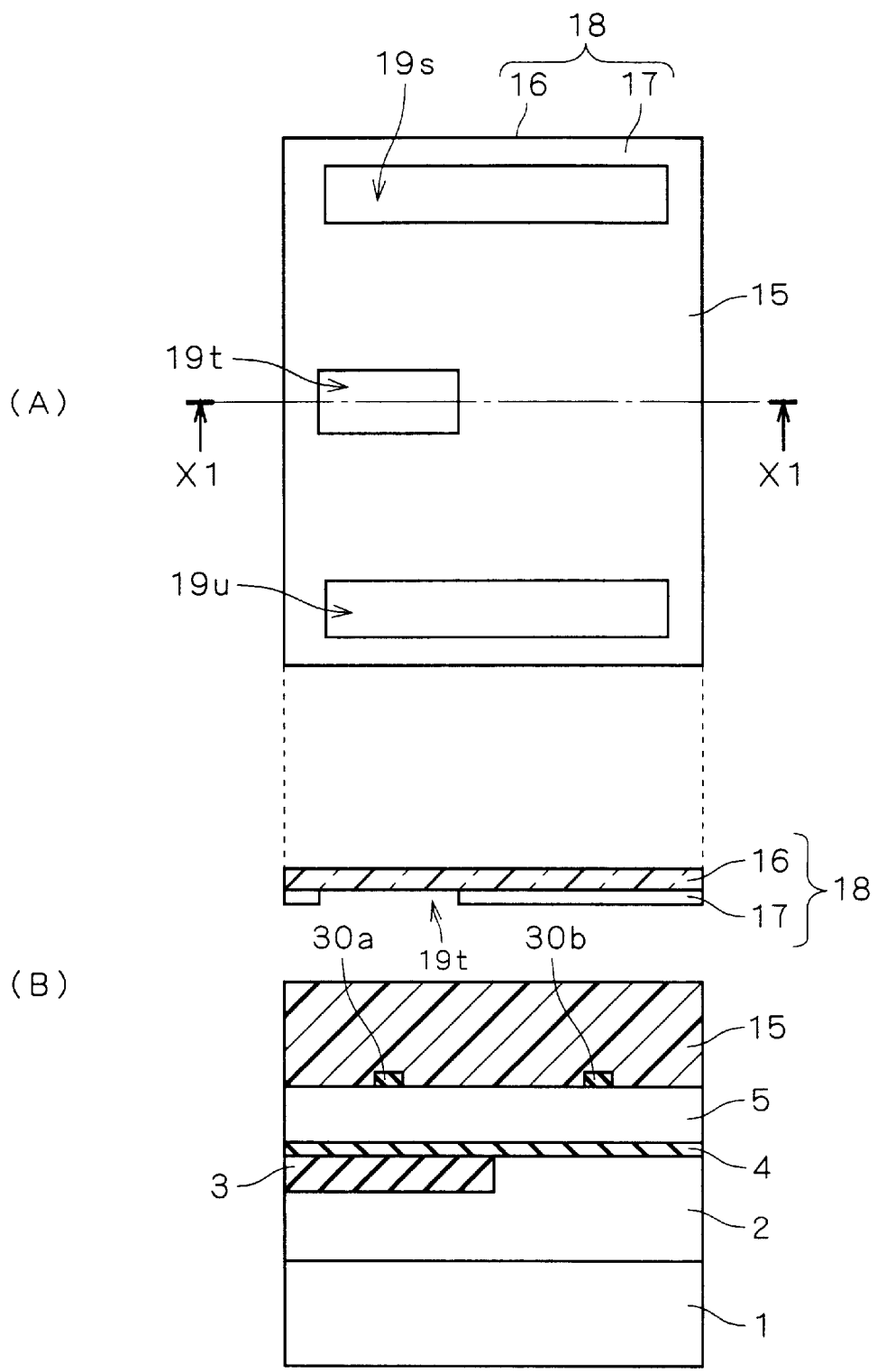

Referring to FIG. 15, the photoresist 15 is applied entirely onto the polysilicon film 5 so as to cover the silicon oxide films 30a and 30b. Next, with reference to FIG. 16, the photoresist 15 is exposed to light using the photomask 18. FIG. 17 shows the photoresist 15 after being exposed to light in the step shown in FIG. 16.

Referring to FIG. 18, the exposed portions 20 of the photoresist 15 are removed by development. Thus, the openings 21s to 21u are formed in the photoresist 15. In the opening 21s, upper end portions of the respective silicon oxide films 30a and 30b are exposed. In the opening 21u, lower end portions of the respective silicon oxide films 30a and 30b are exposed. In the opening 21t, a middle portion of the silicon oxide film 30a is exposed.

Figure 19:
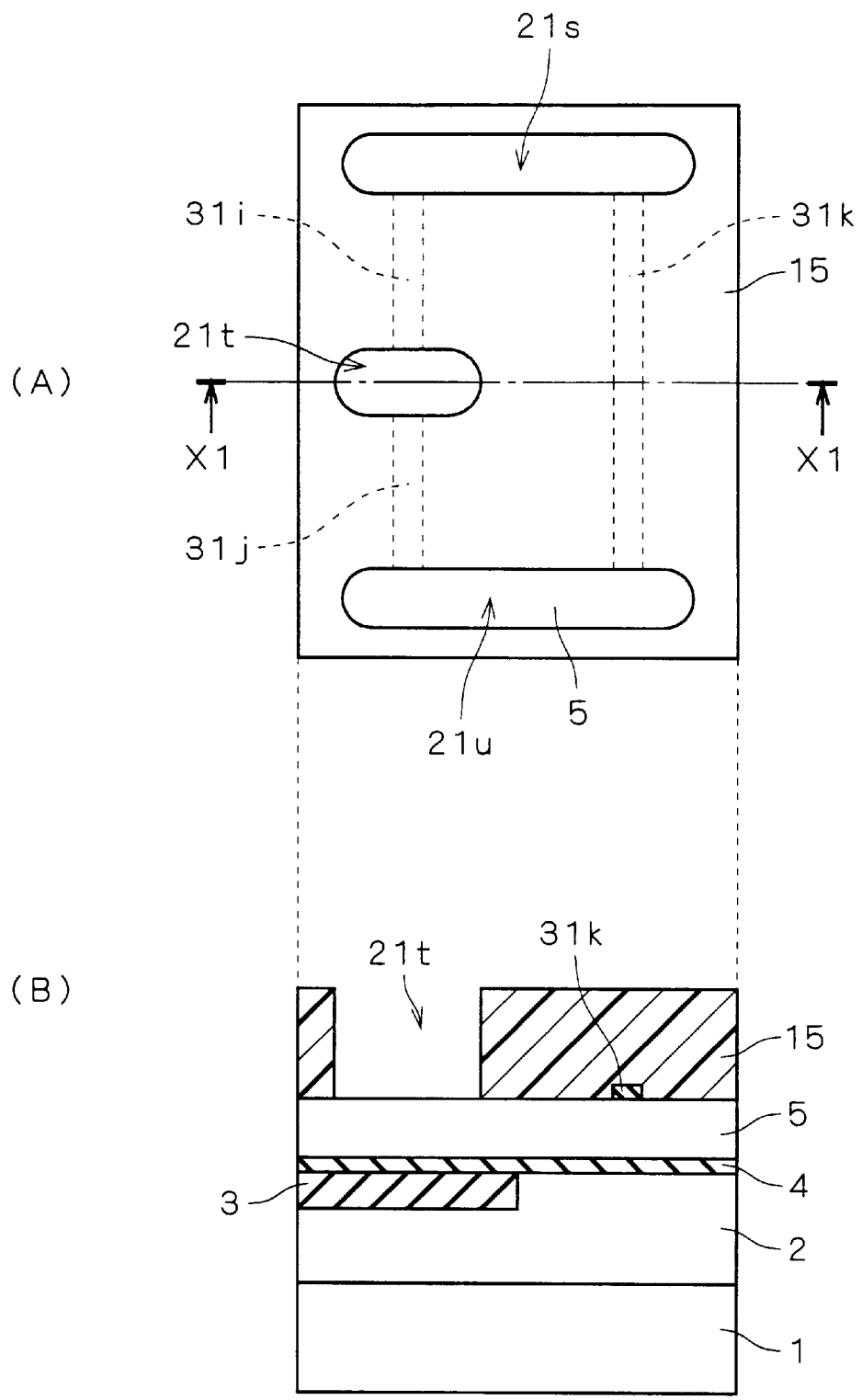

Referring to FIG. 19, using the photoresist 15 as an etch mask, the portions of the silicon oxide films 30a and 30b which are exposed in the openings 21s to 21u are etched away. Portions of the silicon oxide films 30a and 30b which are covered with the photoresist 15 are not etched away by this etching process but are left as silicon oxide films 31 (designated by the reference characters 31i to 31k in FIG. 19).

Figure 20:
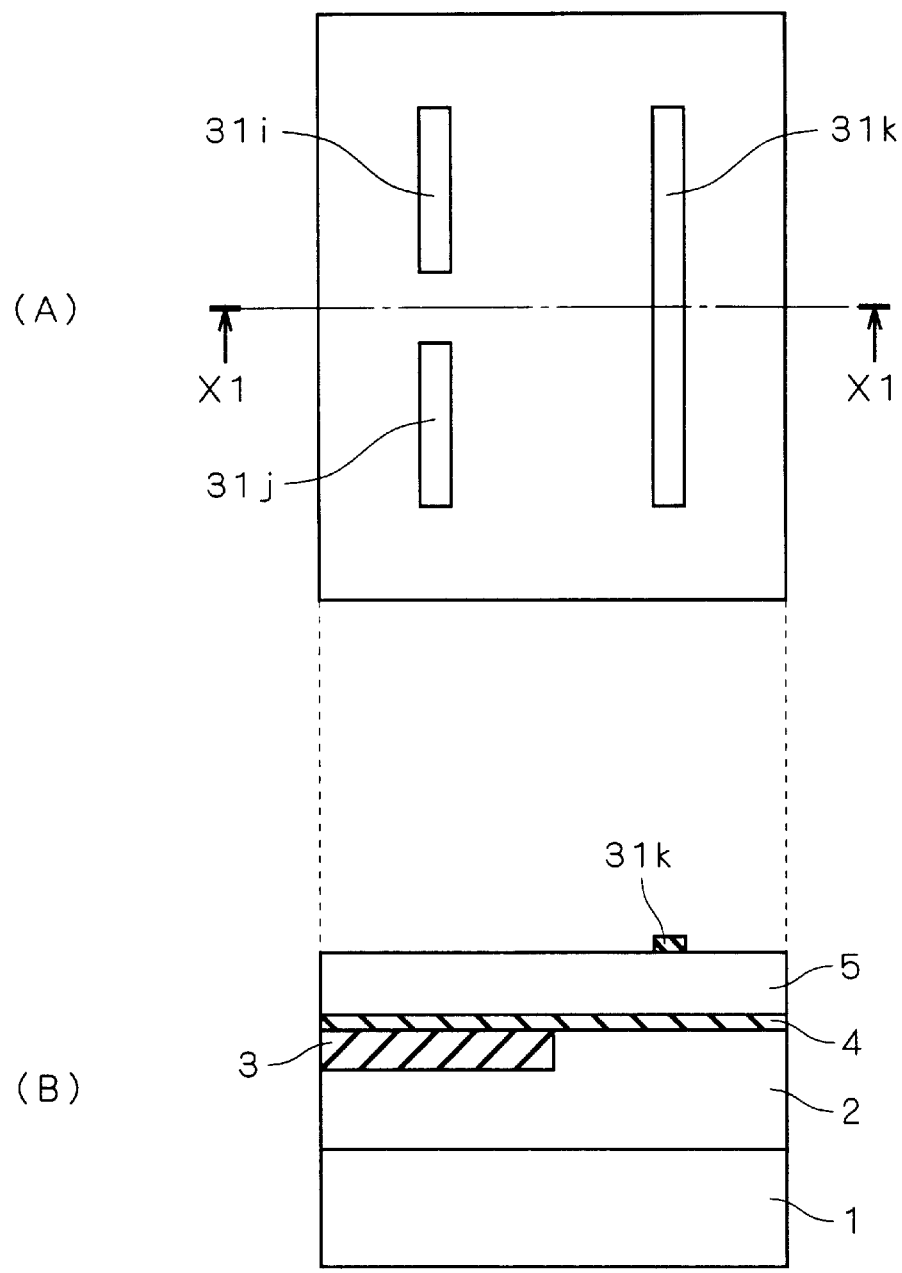

Referring to FIG. 20, the photoresist 15 is removed. With reference to FIG. 21, using the silicon oxide film 31k as an etch mask (hard mask), the polysilicon film 5 and the silicon oxide film 4 are etched in the order named by an anisotropic dry etching process which exhibits a higher etch rate in the direction of depth of the silicon substrate 1. This removes portions of the polysilicon film 5 and the silicon oxide film 4 which are not covered with the silicon oxide film 31k, to expose upper surfaces of the well 2 and the isolating insulation film 3 under the portions. With reference to the sectional view labelled (B) in FIG. 21, a gate structure 35 (designated by the reference character 35k in FIG. 21) having a multi-layer structure such that a silicon oxide film 34k, a polysilicon film 33k and the silicon oxide film 31k are stacked in the order named is formed on the well 2. The silicon oxide film 34k functions as a gate insulation film, and the polysilicon film 33k functions as a gate electrode. With reference to the top plan view labelled (A) in FIG. 21, gate structures 35i and 35j each having a multi-layer structure similar to the gate structure 35k are formed on the well 2 and the isolating insulation film 3. The reference numeral 35 is also used hereinafter to generically designate the gate structures 35i, 35j and 35k.

Thereafter, sidewalls are formed on the side surfaces of each of the gate structures 35, and then source/drain regions are formed in the upper surface of the well 2. MOSFETs are formed by the above-mentioned process steps. Then, an interconnection step is performed, and a semiconductor device is thus completed.

Figure 14:
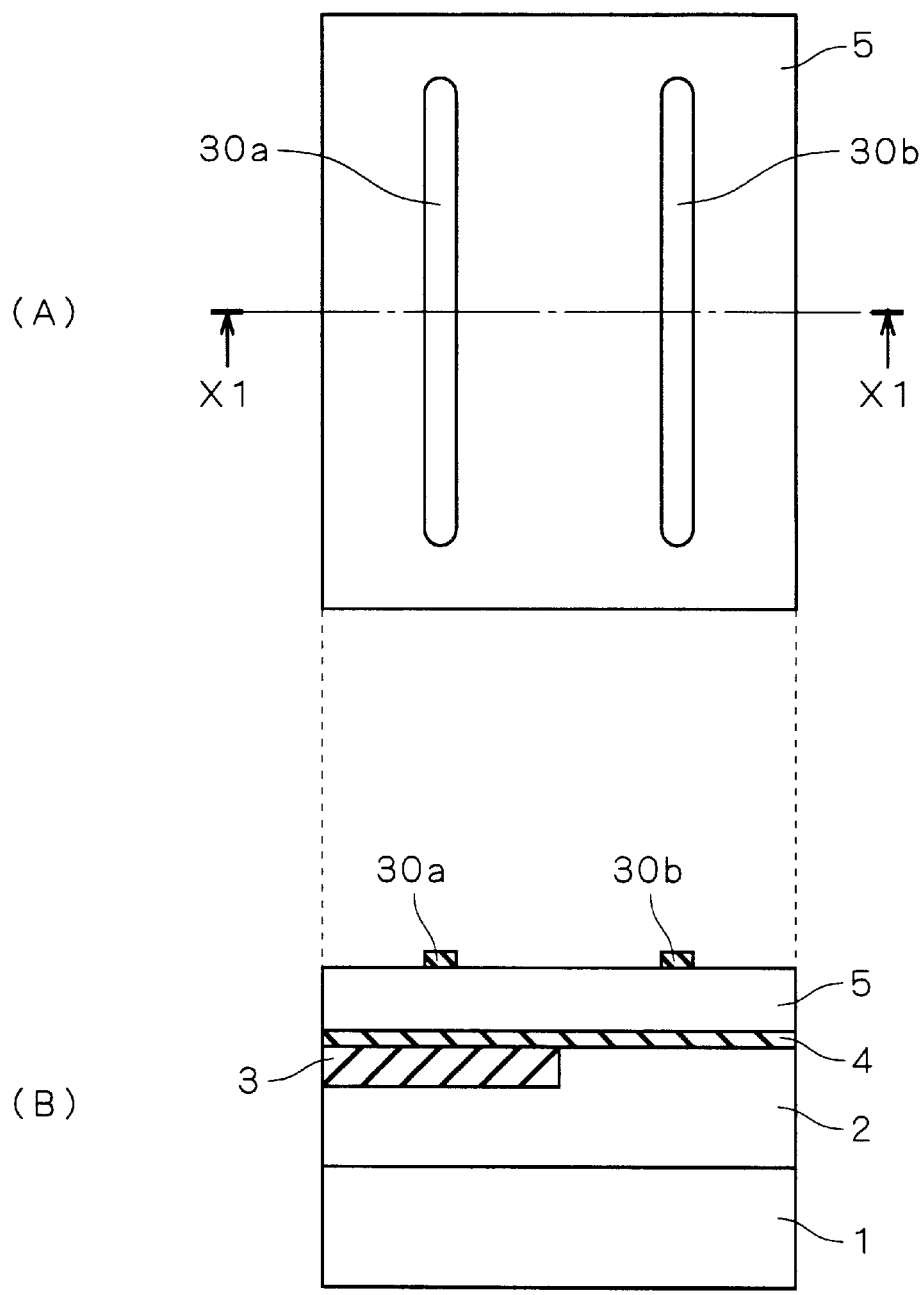

In the method of manufacturing the semiconductor device according to the second preferred embodiment, as described hereinabove, the silicon oxide films 14a and 14b are made thinner in the step shown in FIG. 14. The finally obtained gate structures 35 have an accordingly shorter gate length. Therefore, the MOSFETs manufactured by the method according to the second preferred embodiment can operate at a higher speed than those manufactured by the method according to the first preferred embodiment.

Additionally, the step (shown in FIG. 14) of thinning the silicon oxide films 14a and 14b is executed prior to the etching step (shown in FIG. 19) for defining the ends of the silicon oxide films 31. This appropriately avoids gate width variations resulting from etching of the ends of the silicon oxide films 31 in the isotropic etching process for thinning the silicon oxide films 14a and 14b, and hindrance of the high level of integration because of an increased distance between the silicon oxide films 31i and 31j.

Third Preferred Embodiment

Figure 22:
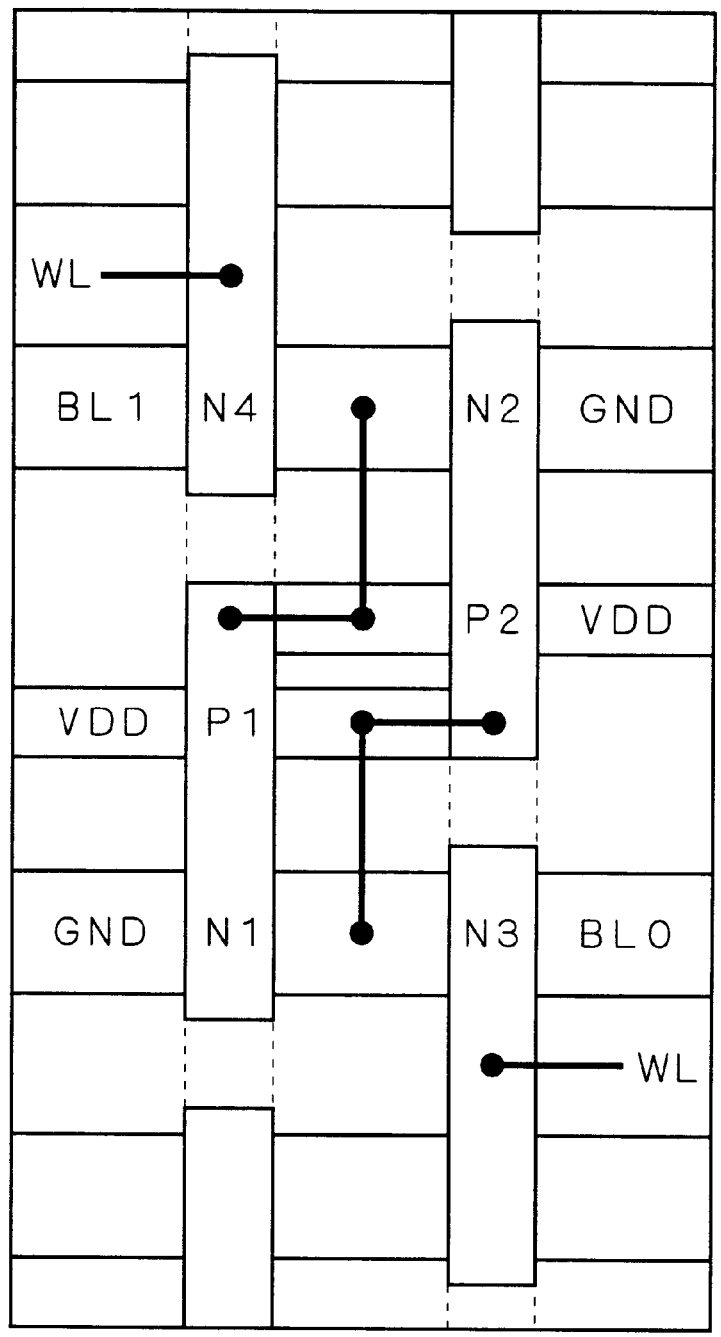
FIG. 22 is a top plan view showing a layout configuration of an SRAM memory cell according to a third preferred embodiment of the present invention.

A third preferred embodiment of the present invention is an application of the method of manufacturing the semiconductor device according to the first and second preferred embodiments to the formation of the gate electrodes of respective transistors constituting an SRAM memory cell. FIG. 22 is a top plan view showing a layout configuration of an SRAM memory cell according to the third preferred embodiment. Such a layout configuration is disclosed in, for example, Japanese Patent Application Laid-Open No. 10-178110 (1998), and thus is not described in detail herein.

First, a gate insulation film and a polysilicon film are formed in the order named entirely on a silicon substrate, and then a silicon oxide film is formed entirely on the polysilicon film. Next, the silicon oxide film is patterned by a photolithographic process using a first photomask and an anisotropic dry etching process. Thus, a silicon oxide film of a linear shape including a portion indicated by broken lines in FIG. 22 is formed over regions in which the gate electrodes of a driver transistor N1, a load transistor P1 and an access transistor N4 are to be formed respectively, and another silicon oxide film of a linear shape including a portion indicated by broken lines in FIG. 22 is formed over regions in which the gate electrodes of a driver transistor N2, a load transistor P2 and an access transistor N3 are to be formed respectively. The steps discussed above correspond to those up to and including the step shown in FIG. 6 in the method according to the first preferred embodiment.

Next, the portions of the silicon oxide films indicated by the broken lines in FIG. 22 are removed by a photolithographic process using a second photomask and an anisotropic dry etching process. The steps discussed above correspond to those up to and including the step shown in FIG. 12 in the method according to the first preferred embodiment.

Using the remaining silicon oxide films as a hard mask, the polysilicon film is etched to form the gate electrodes of the above-mentioned transistors. The steps discussed above correspond to those up to and including the step shown in FIG. 13 in the method according to the first preferred embodiment.

In the method of manufacturing the semiconductor device according to the third preferred embodiment, as described above, the method of manufacturing the semiconductor device according to the first and second preferred embodiments is applied to the formation of the gate electrodes of the respective transistors constituting the SRAM memory cell. This allows a distance between the gate electrode of the access transistor N4 and the gate electrode of the load transistor P1, a distance between the gate electrode of the access transistor N3 and the gate electrode of the load transistor P2 and a distance between the gate electrodes of adjacent driver transistors to be set to the minimum line width, thereby achieving reduction in cell size.

Fourth Preferred Embodiment

Figure 23:
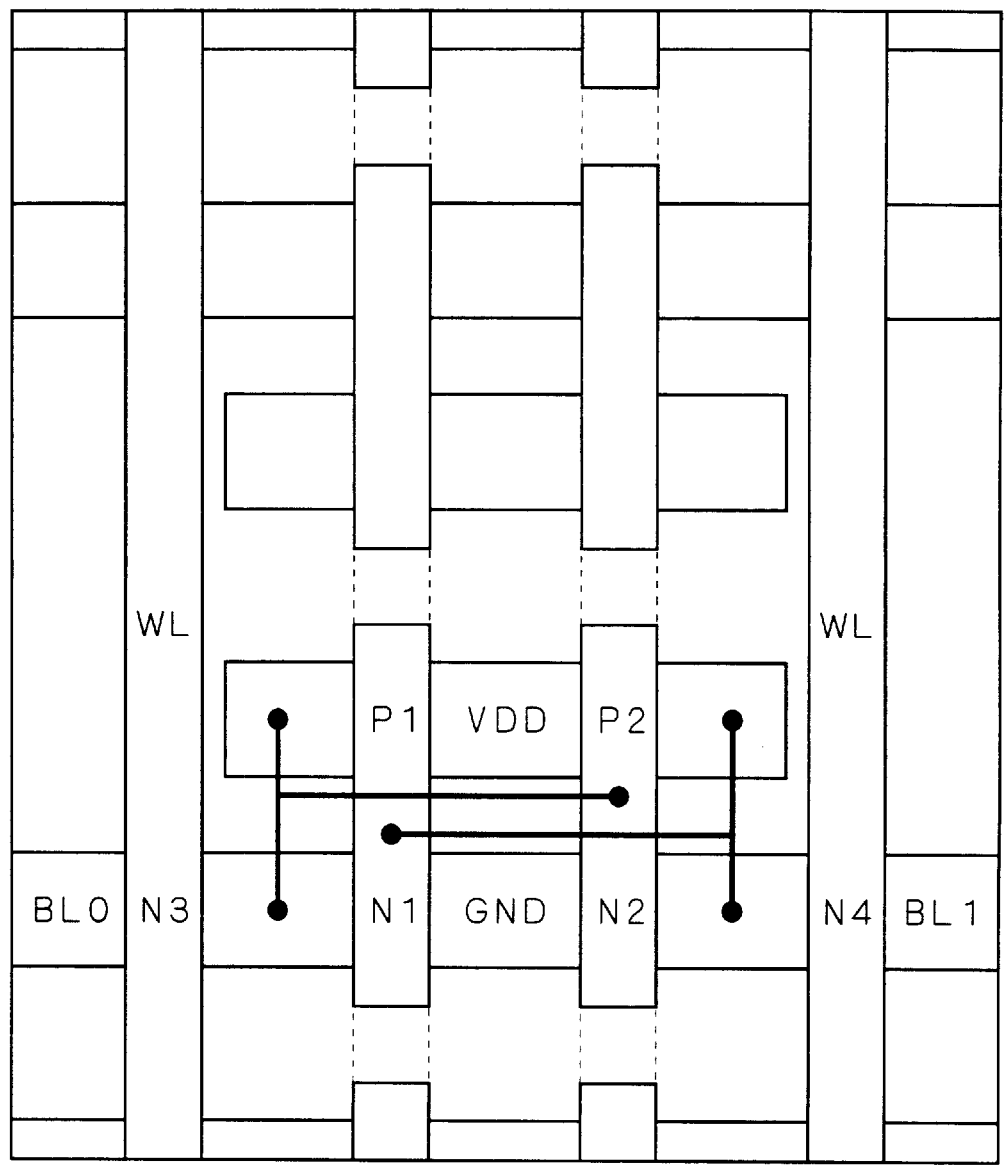
FIG. 23 is a top plan view showing a layout configuration of an SRAM memory cell according to a fourth preferred embodiment of the present invention.

A fourth preferred embodiment of the present invention is an application of the method of manufacturing the semiconductor device according to the first and second preferred embodiments to the formation of gate electrodes in an SRAM memory cell different from that of FIG. 22. FIG. 23 is a top plan view showing a layout configuration of an SRAM memory cell according to the fourth preferred embodiment. Such a layout configuration is disclosed in, for example, Japanese Patent Application Laid-Open No. 2000-36543, and thus is not described in detail herein.

First, a gate insulation film and a polysilicon film are formed in the order named entirely on a silicon substrate, and then a silicon oxide film is formed entirely on the polysilicon film. Next, the silicon oxide film is patterned by a photolithographic process using a first photomask and an anisotropic dry etching process. Thus, a silicon oxide film of a linear shape including a portion indicated by broken lines in FIG. 23 is formed over regions in which the gate electrodes of the driver transistor N1 and the load transistor P1 are to be formed respectively, and another silicon oxide film of a linear shape including a portion indicated by broken lines in FIG. 23 is formed over regions in which the gate electrodes of the driver transistor N2 and the load transistor P2 are to be formed respectively. The steps discussed above correspond to those up to and including the step shown in FIG. 6 in the method according to the first preferred embodiment.

Next, the portions of the silicon oxide films indicated by the broken lines in FIG. 23 are removed by a photolithographic process using a second photomask and an anisotropic dry etching process. The steps discussed above correspond to those up to and including the step shown in FIG. 12 in the method according to the first preferred embodiment.

Using the remaining silicon oxide films as a hard mask, the polysilicon film is etched to form the gate electrodes of the above-mentioned transistors. The steps discussed above correspond to those up to and including the step shown in FIG. 13 in the method according to the first preferred embodiment.

In the method of manufacturing the semiconductor device according to the fourth preferred embodiment, as described above, the method of manufacturing the semiconductor device according to the first and second preferred embodiments is applied to the formation of the gate electrodes in the SRAM memory cell. This allows a distance between the gate electrodes of adjacent driver transistors and a distance between the gate electrodes of adjacent load transistors to be set to the minimum line width, thereby achieving reduction in cell size.

Fifth Preferred Embodiment

Figure 24:
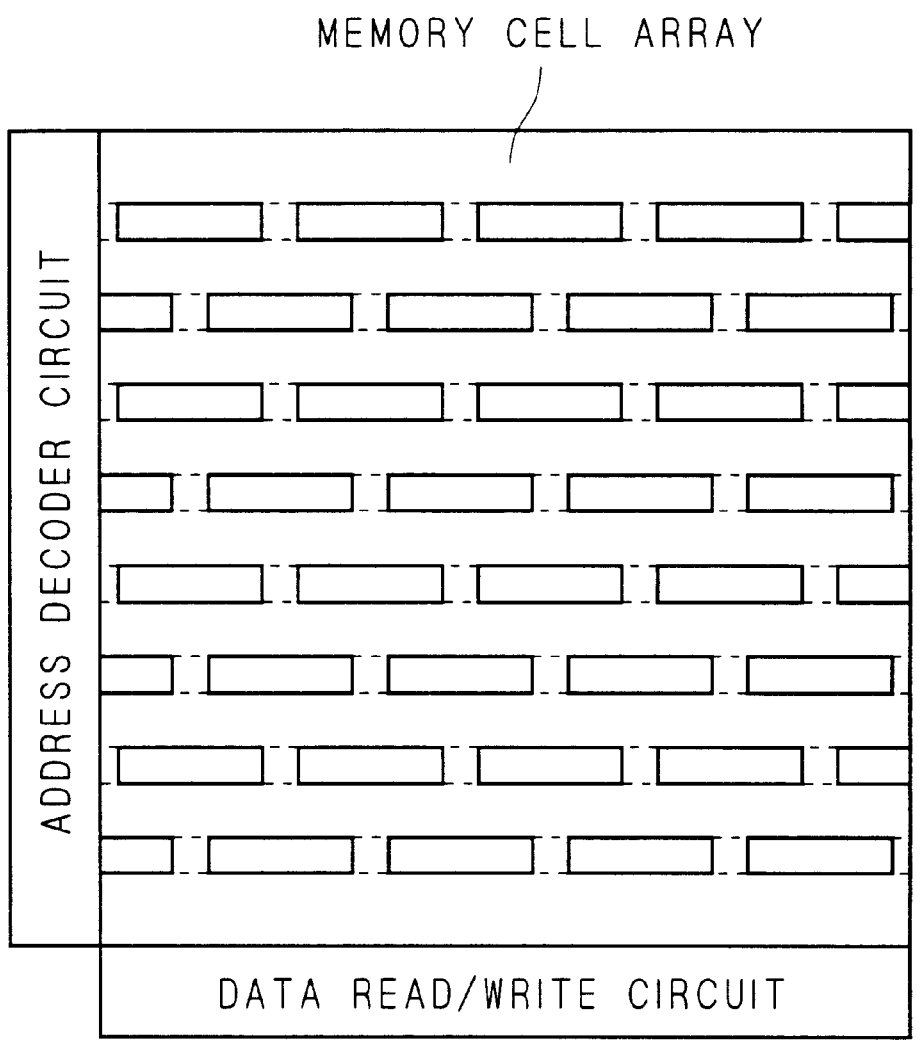
FIG. 24 is a top plan view showing a configuration of a memory cell array according to a fifth preferred embodiment of the present invention.
Figure 27:
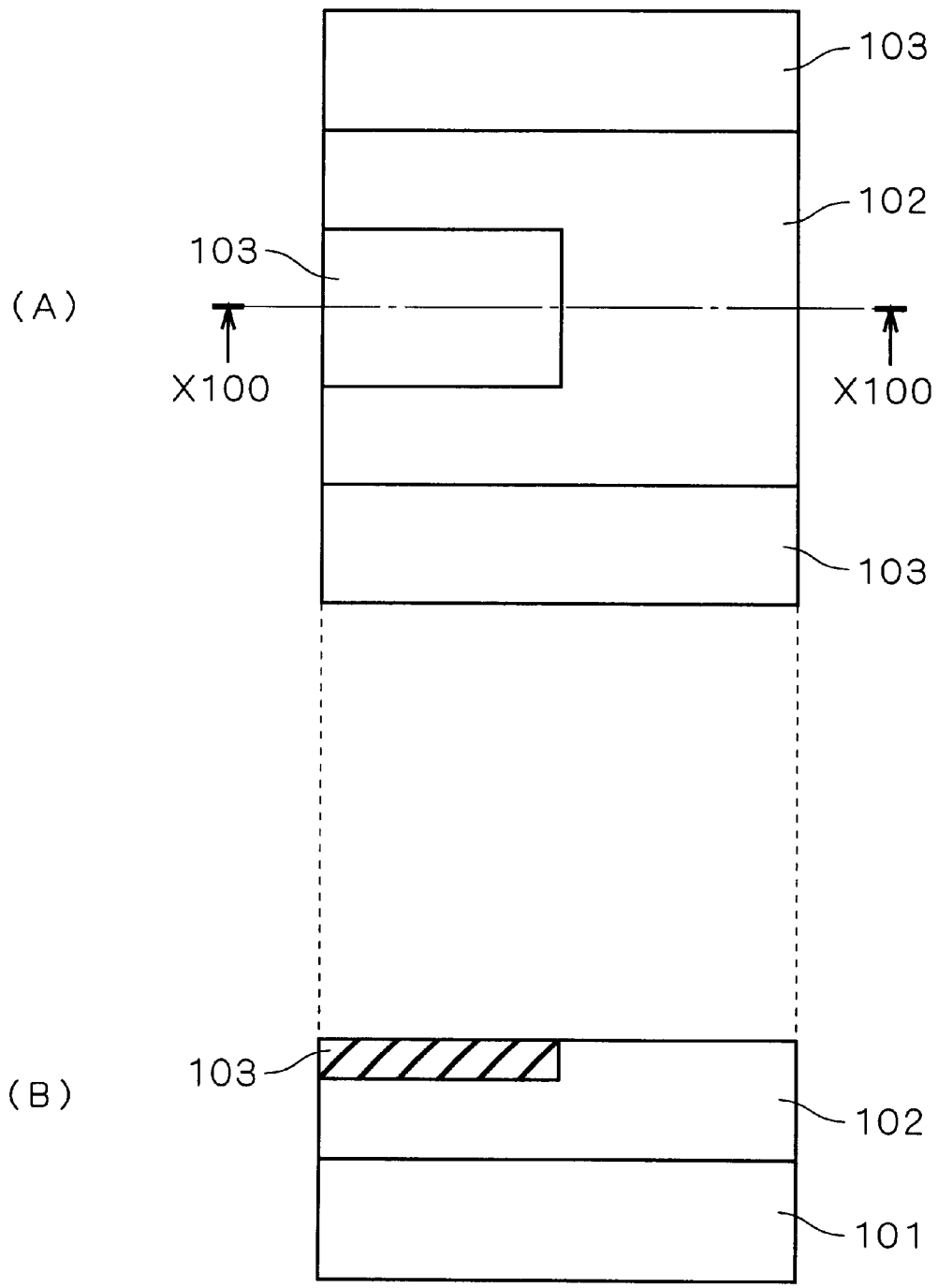
FIGS. 27 through 33 show a background art method of manufacturing a semiconductor device in order of process steps.
Figure 28:
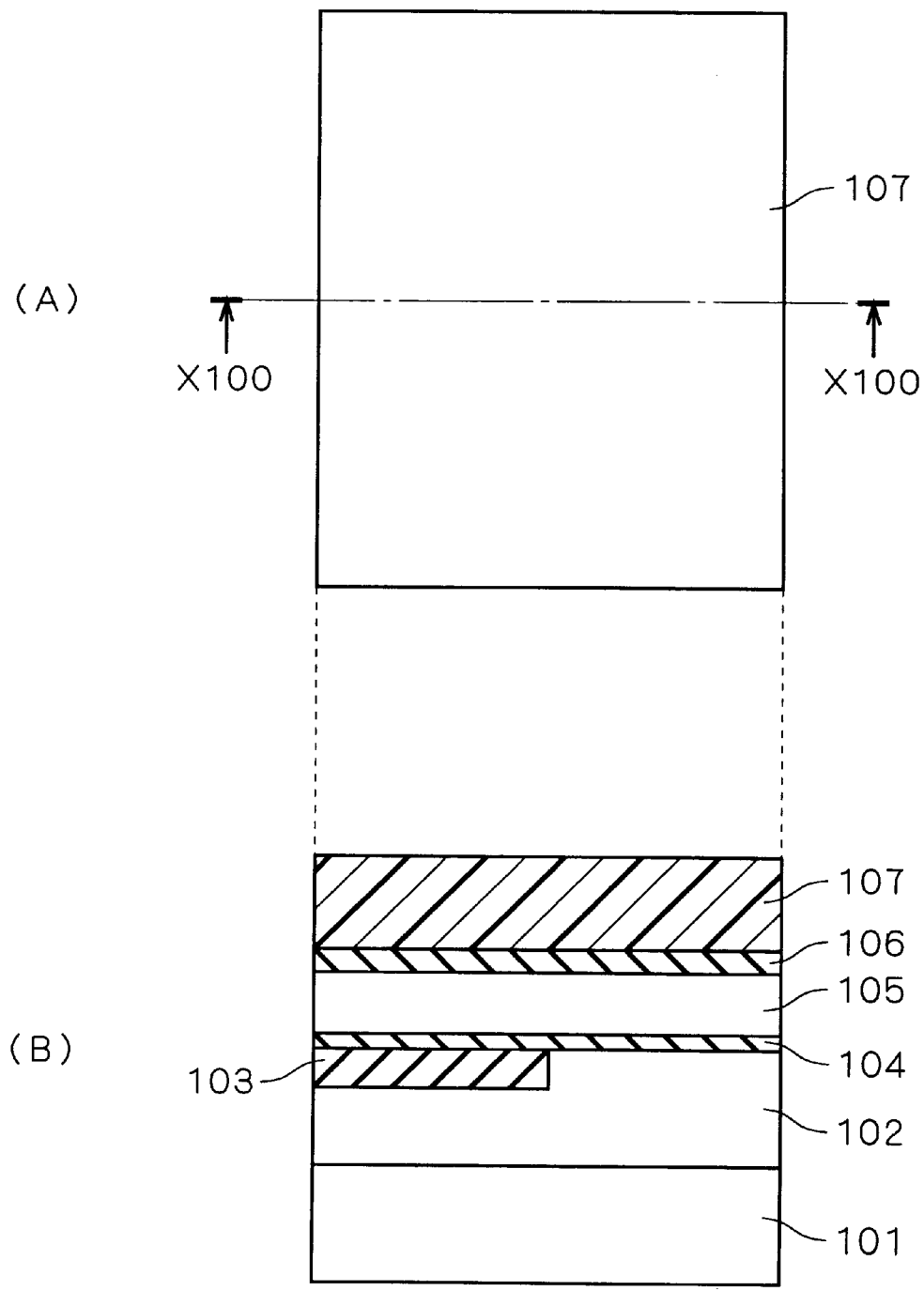
Figure 29:
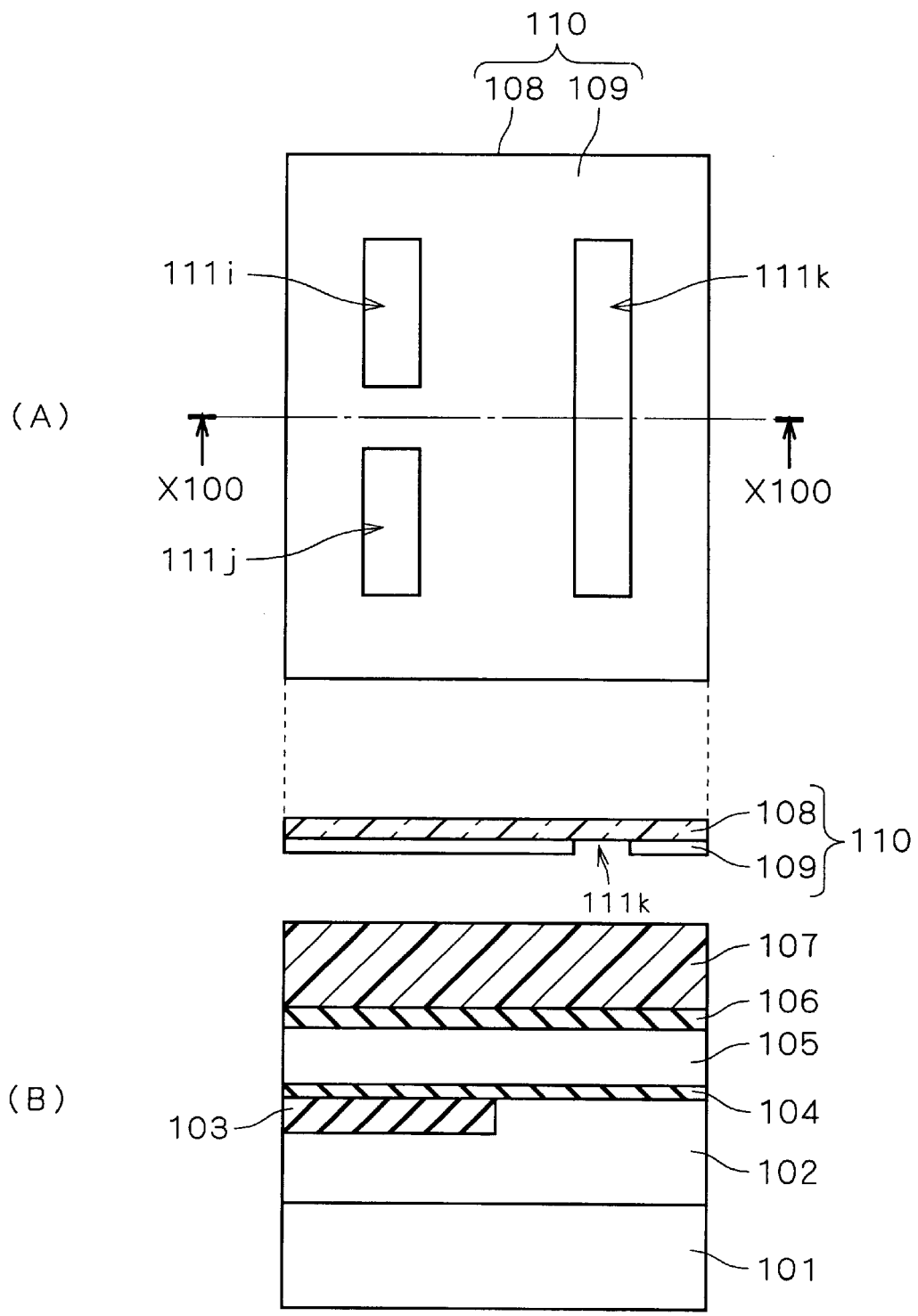
Figure 30:
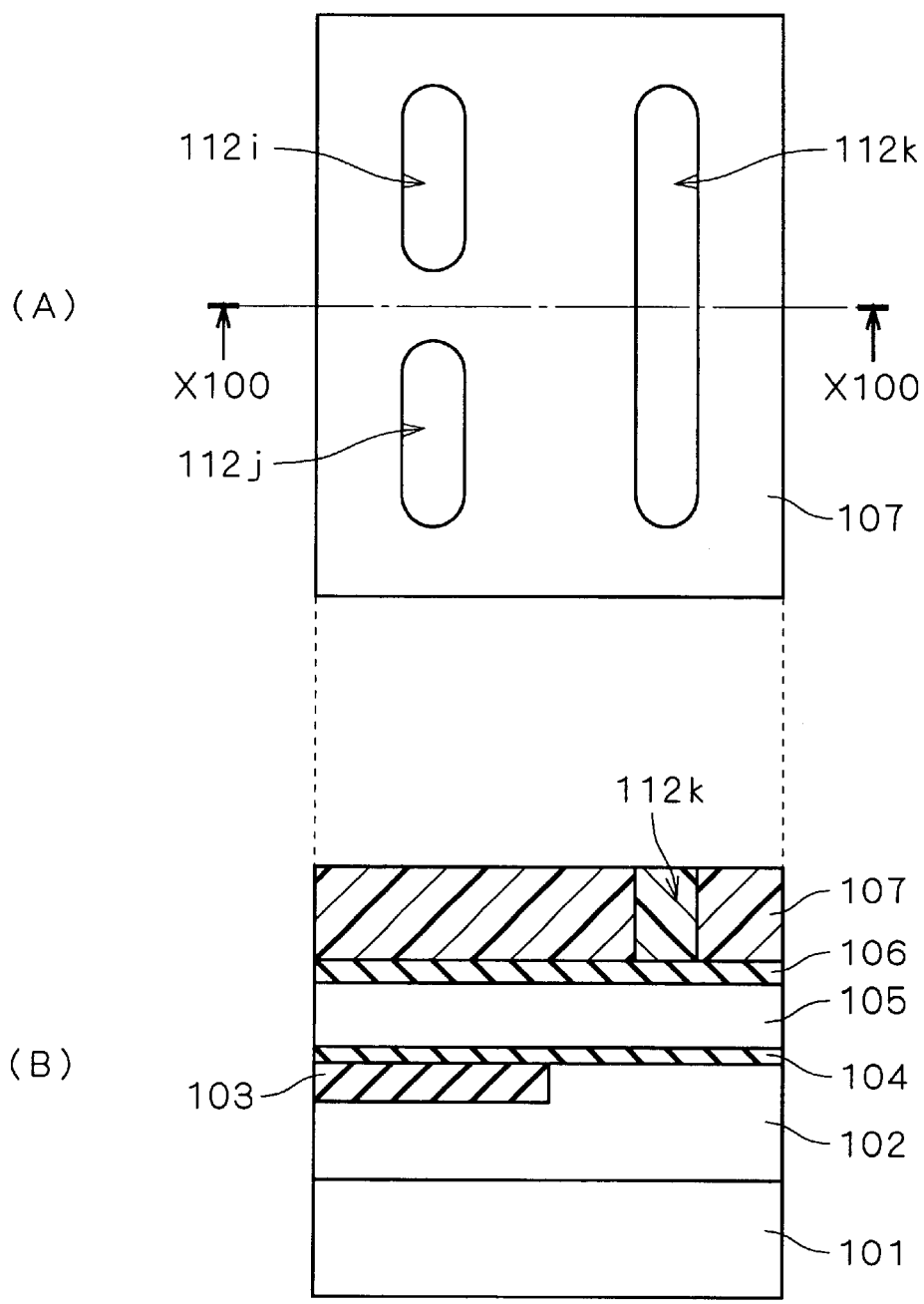
Figure 31:
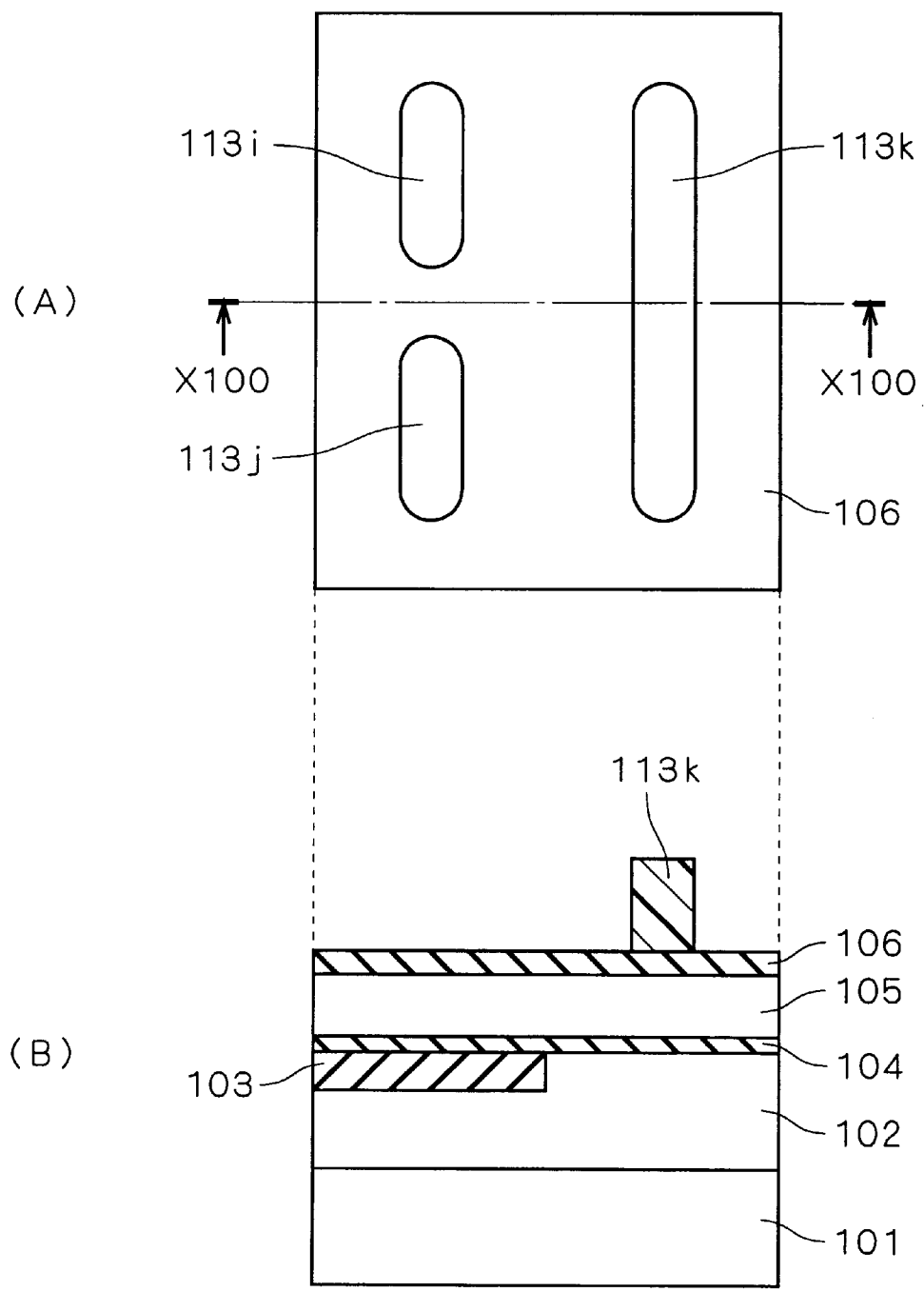
Figure 32:
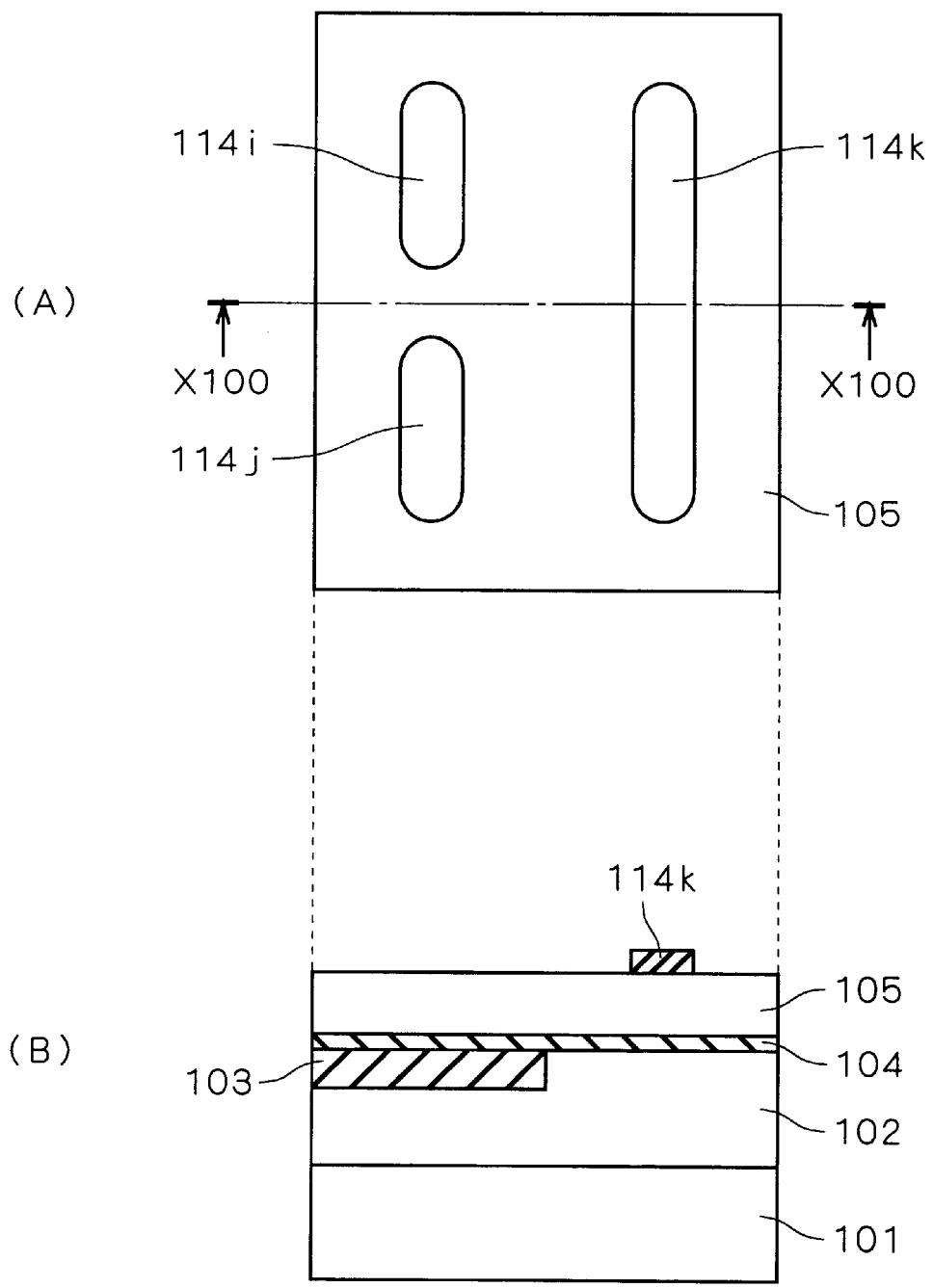
Figure 33:
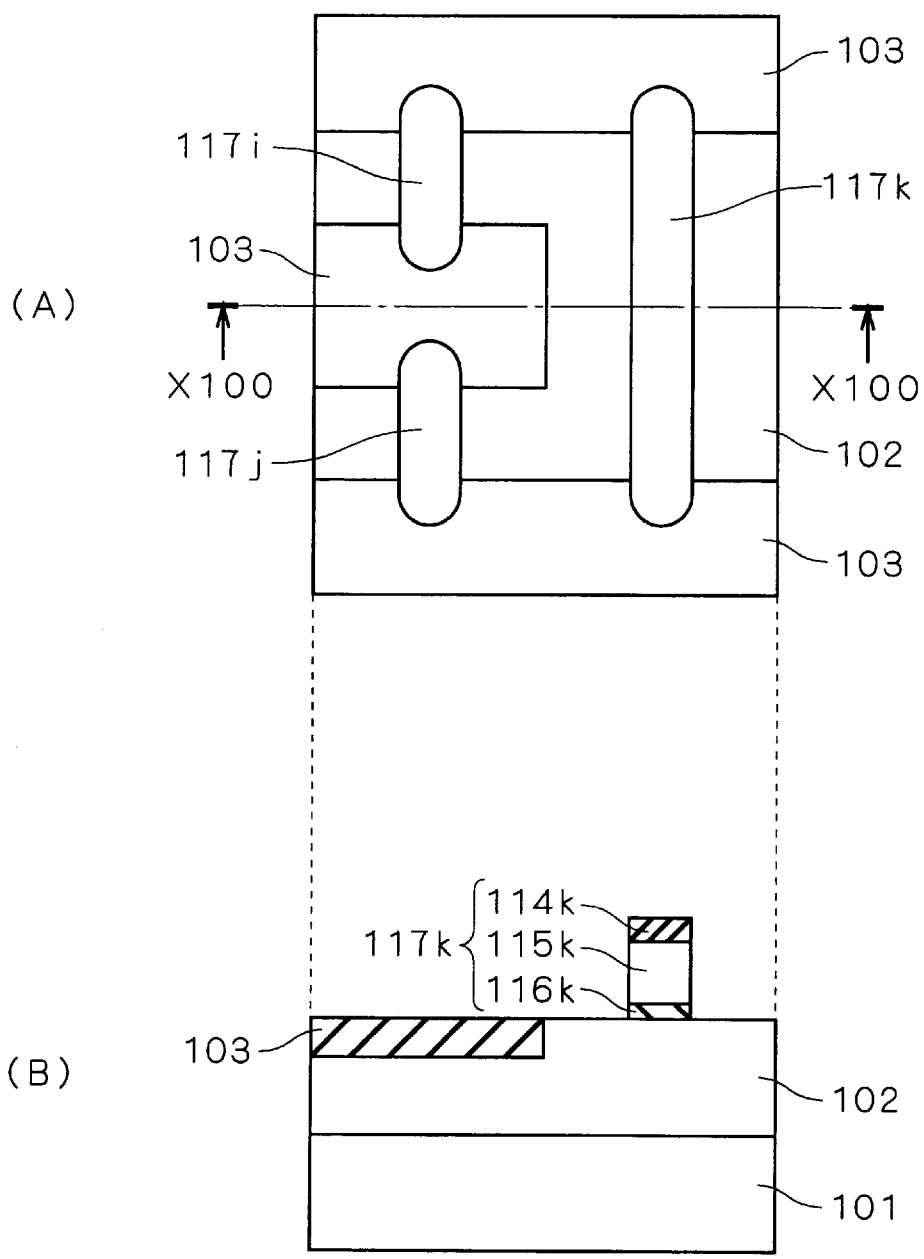

A fifth preferred embodiment of the present invention is an application of the method of manufacturing the semiconductor device according to the first and second preferred embodiments to the formation of the gate electrodes of respective memory cell transistors in a memory cell array. FIG. 24 is a top plan view showing a configuration of a memory cell array according to the fifth preferred embodiment. The memory cell array comprises a plurality of memory cell transistors disposed in a matrix and connected to an address decoder circuit and a data read/write circuit. Only the gate electrodes of the respective memory cell transistors are shown in FIG. 24.

First, a gate insulation film and a polysilicon film are formed in the order named entirely on a silicon substrate, and then a silicon oxide film is formed entirely on the polysilicon film. Next, the silicon oxide film is patterned by a photolithographic process using a first photomask and an anisotropic dry etching process. Thus, a silicon oxide film of a linear shape including portions indicated by broken lines in FIG. 24 is formed in each row over regions in which the gate electrodes of memory cell transistors in the same row are to be formed respectively. The steps discussed above correspond to those up to and including the step shown in FIG. 6 in the method according to the first preferred embodiment.

Next, the portions of the silicon oxide films indicated by the broken lines in FIG. 24 are removed by a photolithographic process using a second photomask and an anisotropic dry etching process. The steps discussed above correspond to those up to and including the step shown in FIG. 12 in the method according to the first preferred embodiment.

Using the remaining silicon oxide films as a hard mask, the polysilicon film is etched to form the gate electrodes of the plurality of memory cell transistors. The steps discussed above correspond to those up to and including the step shown in FIG. 13 in the method according to the first preferred embodiment.

In the method of manufacturing the semiconductor device according to the fifth preferred embodiment, as described above, the method of manufacturing the semiconductor device according to the first and second preferred embodiments is applied to the formation of the gate electrodes of the respective memory cell transistors in the memory cell array. This allows a distance between the gate electrodes of memory cell transistors arranged adjacent to each other in a row direction to be set to the minimum line width, thereby achieving size reduction of the memory cell array.

The invention according to the fifth preferred embodiment is applicable not only to the memory cell array of the type in which the gate electrodes extend in the row direction as shown in FIG. 24 but also to a memory cell array of the type in which the gate electrodes extend in a column direction as shown in FIG. 25.

Sixth Preferred Embodiment

A sixth preferred embodiment of the present invention is an application of the method of manufacturing the semiconductor device according to the first and second preferred embodiments to the formation of the gate electrodes of respective transistors in a macrocell region of a semiconductor chip. FIG. 26 is a top plan view showing a layout configuration of a macrocell region according to the sixth preferred embodiment. In the macrocell region, a plurality of CMOS transistors are formed in each macrocell block (also referred to simply as a "cell block").

First, a gate insulation film and a polysilicon film are formed in the order named entirely on a silicon substrate, and then a silicon oxide film is formed entirely on the polysilicon film. Next, the silicon oxide film is patterned by a photolithographic process using a first photomask and an anisotropic dry etching process. Thus, a silicon oxide film of a linear shape including portions indicated by broken lines in FIG. 26 is formed in each column over regions in which the gate electrodes of transistors arranged in the vertical direction of FIG. 26 are to be formed respectively. The steps discussed above correspond to those up to and including the step shown in FIG. 6 in the method according to the first preferred embodiment.

Next, the portions of the silicon oxide films indicated by the broken lines in FIG. 26 are removed by a photolithographic process using a second photomask and an anisotropic dry etching process. The steps discussed above correspond to those up to and including the step shown in FIG. 12 in the method according to the first preferred embodiment.

Using the remaining silicon oxide films as a hard mask, the polysilicon film is etched to form the gate electrodes of the plurality of transistors. The steps discussed above correspond to those up to and including the step shown in FIG. 13 in the method according to the first preferred embodiment.

In the method of manufacturing the semiconductor device according to the sixth preferred embodiment, as described above, the method of manufacturing the semiconductor device according to the first and second preferred embodiments is applied to the formation of the gate electrodes of the respective transistors in the macrocell region. This allows a distance between the gate electrodes of transistors included in different cell blocks and adjacent to each other to be set to the minimum line width, thereby achieving size reduction of the macrocell region.

While the invention has been described in detail, the foregoing description is in all aspects illustrative and not restrictive. It is understood that numerous other modifications and variations can be devised without departing from the scope of the invention.

What is claimed is:

1. A method of manufacturing a semiconductor device, comprising the steps of:
   (a) forming a first film on a semiconductor substrate, said first film being electrically conductive;
   (b) forming a second film on said first film;
   (c) forming a first photoresist on said second film;
   (d) exposing said first photoresist to light using a first photomask having a first pattern;
   (e) developing said first photoresist exposed in said step (d);
   (f) patterning said second film using said first photoresist developed in said step (e) to form a third film over a region in which a gate electrode is to be formed, said third film being wider than a gate width of said gate electrode;
   (g) forming a second photoresist on said first film to cover said third film, said step (h) being executed after said step (f);
   (h) exposing said second photoresist to light using a second photomask having a second pattern defining an end of said gate electrode as seen in a direction of said gate width;
   (i) developing said second photoresist exposed in said step (h);
   (j) patterning said third film using said second photoresist developed in said step (i) to form a fourth film; and
   (k) etching said first film using said fourth film as an etch mask to form said gate electrode.

2. The method according to claim 1, further comprising the step of
   (l) thinning said third film by etching, said step (l) being executed after said step (f).

3. The method according to claim 2, wherein
   said step (l) is executed before said step (j).

4. The method according to claim 1, wherein said method is applied to formation of gate electrodes of respective transistors constituting an SRAM memory cell.

5. The method according to claim 1, wherein said method is applied to formation of gate electrodes of respective memory cell transistors in a memory cell array.

6. The method according to claim 1, wherein said method is applied to formation of gate electrodes of respective transistors in a macrocell region.

7. A method of manufacturing a semiconductor device, comprising the steps of:
   (a) forming a first film on a semiconductor substrate, said first film being electrically conductive;
   (b) forming a second film on said first film;
   (c) forming a first photoresist on said second film;
   (d) exposing said first photoresist to light using a first photomask having a first pattern;
   (e) developing said first photoresist exposed in said step (d);
   (f) patterning said second film using said first photoresist developed in said step (e) to form a third film extending continuously from over a region in which a first gate electrode is to be formed to over a region in which a second gate electrode is to be formed, said first gate electrode and said second gate electrode being arranged adjacent to each other in a direction of a gate width;
   (g) forming a second photoresist on said first film to cover said third film, said step (g) being executed after said step (f);
   (h) exposing said second photoresist to light using a second photomask having a second pattern defining an end of said first gate electrode which is closer to said second gate electrode and an end of said second gate electrode which is closer to said first gate electrode;
   (i) developing said second photoresist exposed in said step (h);
   (j) patterning said third film using said second photoresist developed in said step (i) to form a fourth film; and
   (k) etching said first film using said fourth film as an etch mask to form said first and second gate electrodes.

8. The method according to claim 7, further comprising the step of
   (l) thinning said third film by etching, said step (l) being executed after said step (f).

9. The method according to claim 8, wherein
   said step (l) is executed before said step (j).

10. The method: according to claim 7, wherein said method is applied to formation of gate electrodes of respective transistors constituting an SRAM memory cell.

11. The method according to claim 7, wherein said method is applied to formation of gate electrodes of respective memory cell transistors in a memory cell array.

12. The method according to claim 7, wherein said method is applied to formation of gate electrodes of respective transistors in a macrocell region.

13. A method of manufacturing a semiconductor device having an electrically conductive pattern, comprising the steps of:

forming an electrically conductive first film;

forming a second film on said first film;

forming a first photoresist on said second film;

exposing said first photoresist to light through a first photomask;

developing said first photoresist after exposing;

patterning said second film using the developed first photoresist to form a first patterned film;

forming a second photoresist on said first film to cover said first patterned film;

exposing said second photoresist to light through a second photomask;

developing said second photoresist after exposing;

patterning said first patterned film using said developed second photoresist to form a second patterned film; the step of patterning said first patterned film including the step of etching said first patterned film to remove at least an end portion of said first patterned film; and etching said first film using said second patterned film as an etch mask to form said conductive pattern.

14. The method according to claim 13, wherein said first patterned film is divided into plural parts by etching said first patterned film.

15. The method according to claim 13, further comprising the step of etching said first patterned film for thinning.

16. The method according to claim 15, wherein said first patterned film is etched isotropically.

* * * * *